(12) United States Patent
Jung et al.

(10) Patent No.: US 11,700,723 B2
(45) Date of Patent: Jul. 11, 2023

(54) SEMICONDUCTOR MEMORY DEVICE

(71) Applicant: SAMSUNG ELECTRONICS CO., LTD., Suwon-si (KR)

(72) Inventors: Seungjae Jung, Suwon-si (KR); Kwangho Park, Cheonan-si (KR); Jaehoon Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/193,739

(22) Filed: Mar. 5, 2021

(65) Prior Publication Data

US 2022/0045064 A1 Feb. 10, 2022

(30) Foreign Application Priority Data

Aug. 5, 2020 (KR) .................. 10-2020-0098193

(51) Int. Cl.
*H01L 27/06* (2006.01)
*H10B 12/00* (2023.01)

(52) U.S. Cl.
CPC ............. *H10B 12/30* (2023.02); *H10B 12/03* (2023.02); *H10B 12/05* (2023.02)

(58) Field of Classification Search
None
See application file for complete search history.

(56) References Cited

U.S. PATENT DOCUMENTS 8,039,332 B2 10/2011 Bernard et al.
8,294,209 B2 10/2012 Jeon et al.
8,441,053 B2 5/2013 Chen et al.
9,576,788 B2 2/2017 Liu et al.
9,953,870 B2 4/2018 Or-Bach et al.
(Continued)

FOREIGN PATENT DOCUMENTS

KR 10-0497672 B1 7/2005
TW 201926652 A 7/2019

OTHER PUBLICATIONS

Communication dated May 23, 2022, issued by the Taiwan Intellectual Property Office in counterpart Taiwanese Application No. 110115024.

*Primary Examiner* — Mohammad M Hoque
*Assistant Examiner* — Kevin Quinto
(74) *Attorney, Agent, or Firm* — Sughrue Mion, PLLC

(57) ABSTRACT

A semiconductor memory device, including a first semiconductor pattern, and a second semiconductor pattern separated from the first semiconductor pattern in a vertical direction; a first bit line electrically connected to a first source/drain region of the first semiconductor pattern, and a second bit line electrically connected to a first source/drain region of the second semiconductor pattern; a word line structure in contact with the first semiconductor pattern and the second semiconductor pattern; and a first data storage element electrically connected to a second source/drain region of the first semiconductor pattern, and a second data storage element electrically connected to a second source/drain region of the second semiconductor pattern, wherein the first semiconductor pattern and the second semiconductor pattern are monocrystalline, and wherein a crystal orientation of the first semiconductor pattern is different from a crystal orientation of the second semiconductor pattern.

20 Claims, 48 Drawing Sheets

(56) References Cited

U.S. PATENT DOCUMENTS

| | | |
|---|---|---|
| 10,535,659 B2 | 1/2020 | Kim et al. |
| 10,867,983 B2 | 12/2020 | Chen et al. |
| 2019/0103407 A1* | 4/2019 | Kim .................... H01L 27/0688 |
| 2019/0164985 A1* | 5/2019 | Lee .................... H01L 27/10873 |
| 2019/0341467 A1 | 11/2019 | Basker et al. |
| 2020/0118996 A1 | 4/2020 | Parikh et al. |
| 2021/0043516 A1* | 2/2021 | Gardner ............ H01L 21/02532 |

* cited by examiner

SEMICONDUCTOR MEMORY DEVICE

CROSS-REFERENCE TO RELATED APPLICATION

This application is based on and claims priority under 35 U.S.C. § 119 to Korean Patent Application No. 10-2020-0098193, filed on Aug. 5, 2020, in the Korean Intellectual Property Office, the disclosure of which is incorporated by reference herein in its entirety.

BACKGROUND

The disclosure relates to a semiconductor memory device, and more particularly, to a three-dimensional (3D) semiconductor memory device.

The high performance, high speed, and compactness of electronic devices continue to be in demand. Accordingly, there continues to be a demand for high integration density in semiconductor memory devices included in electronic devices. The integration density of semiconductor memory devices may be increased by reducing the planar area of a memory cell. However, the reduction of the planar area of a memory cell is limited in terms of processes. To further increase the integration density, 3D semiconductor memory devices having memory cells stacked in a vertical direction have been introduced.

SUMMARY

Provided are a three-dimensional (3D) semiconductor memory device easy to manufacture.

Additional aspects will be set forth in part in the description which follows and, in part, will be apparent from the description, or may be learned by practice of the presented embodiments.

In accordance with an aspect of the disclosure, a semiconductor memory device includes a first semiconductor pattern, and a second semiconductor pattern separated from the first semiconductor pattern in a vertical direction; a first bit line electrically connected to a first source/drain region of the first semiconductor pattern, and a second bit line electrically connected to a first source/drain region of the second semiconductor pattern; a word line structure in contact with the first semiconductor pattern and the second semiconductor pattern; and a first data storage element electrically connected to a second source/drain region of the first semiconductor pattern, and a second data storage element electrically connected to a second source/drain region of the second semiconductor pattern, wherein the first semiconductor pattern and the second semiconductor pattern are monocrystalline, and wherein a crystal orientation of the first semiconductor pattern is different from a crystal orientation of the second semiconductor pattern.

In accordance with an aspect of the disclosure, a semiconductor memory device includes a plurality of semiconductor patterns separated in a vertical direction; a bit line electrically connected to respective first source/drain regions of the plurality of semiconductor patterns; a plurality of word line structures in contact with the plurality of semiconductor patterns, respectively; and a plurality of data storage elements electrically connected to respective second source/drain regions of the plurality of semiconductor patterns, wherein the plurality of semiconductor patterns are monocrystalline, and wherein a crystal orientation of at least one of the plurality of semiconductor patterns is different from a crystal orientation of another one of the plurality of semiconductor patterns.

In accordance with an aspect of the disclosure, a semiconductor memory device includes a plurality of semiconductor patterns arranged in a vertical direction and a first horizontal direction, wherein each of the plurality of semiconductor patterns extends in a second horizontal direction; a plurality of insulating layers separating the plurality of semiconductor patterns in the vertical direction; a bit line electrically connected to respective first source/drain regions of some of the plurality of semiconductor patterns; a word line structure in contact with the some of the plurality of semiconductor patterns; and a plurality of data storage elements electrically connected to respective second source/drain regions of the plurality of semiconductor patterns, wherein the plurality of semiconductor patterns are monocrystalline, and wherein a crystal orientation of at least one of the plurality of semiconductor patterns is different from a crystal orientation of another one of the plurality of semiconductor patterns.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
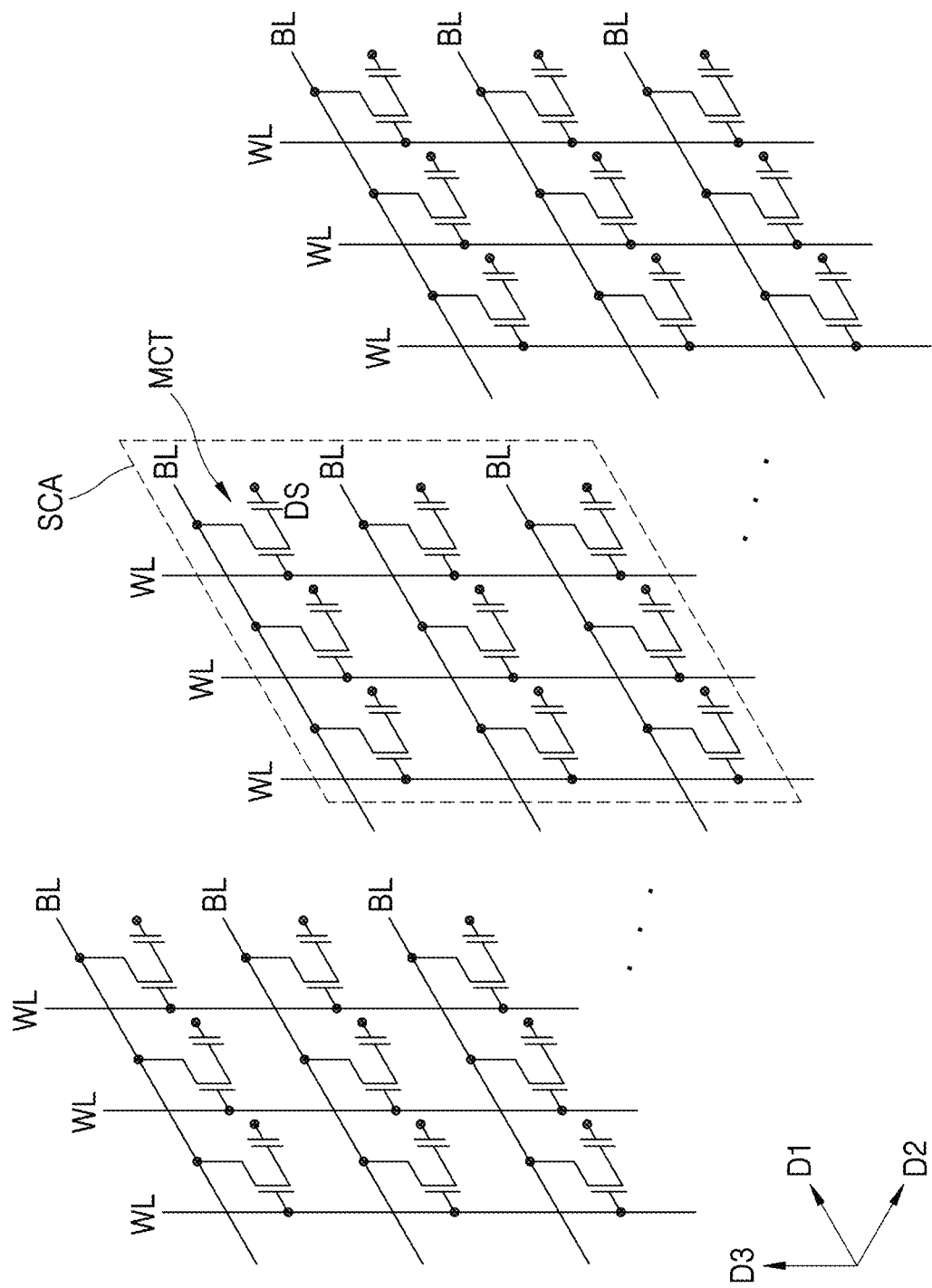
FIG. 1 is a circuit diagram of a cell array of a semiconductor memory device according to an embodiment.

FIG. 1 is a circuit diagram of a cell array of a semiconductor memory device according to an embodiment.

Referring to FIG. 1, the cell array may include a plurality of sub cell arrays SCA. The sub cell arrays SCA may be arranged in a second horizontal direction D2. Each of the sub cell arrays SCA may include a plurality of bit lines BL, a plurality of word lines WL, a plurality of memory cell transistors MCT, and a plurality of data storage elements DS.

Each of the bit lines BL may extend in a first horizontal direction D1. The bit lines BL of one sub cell array SCA may be separated from each other in a vertical direction D3. A bit line BL may be electrically connected to a first source/drain region of each of a plurality of memory cell transistors MCT arranged in the first horizontal direction D1.

Each of the word lines WL may extend in the vertical direction D3. The word lines WL of one sub cell array SCA may be separated from each other in the first horizontal direction D1. A word line WL may be electrically connected to a gate of each of a plurality of memory cell transistors MCT arranged in the vertical direction D3.

The memory cell transistors MCT of one sub cell array SCA may be arranged in the first horizontal direction D1 and the vertical direction D3. Each of the data storage elements DS may be electrically connected to a second source/drain region of a memory cell transistor MCT. The data storage elements DS may include, for example, a magnetic tunnel junction, a phase-change material, or a capacitor.

Figure 2:
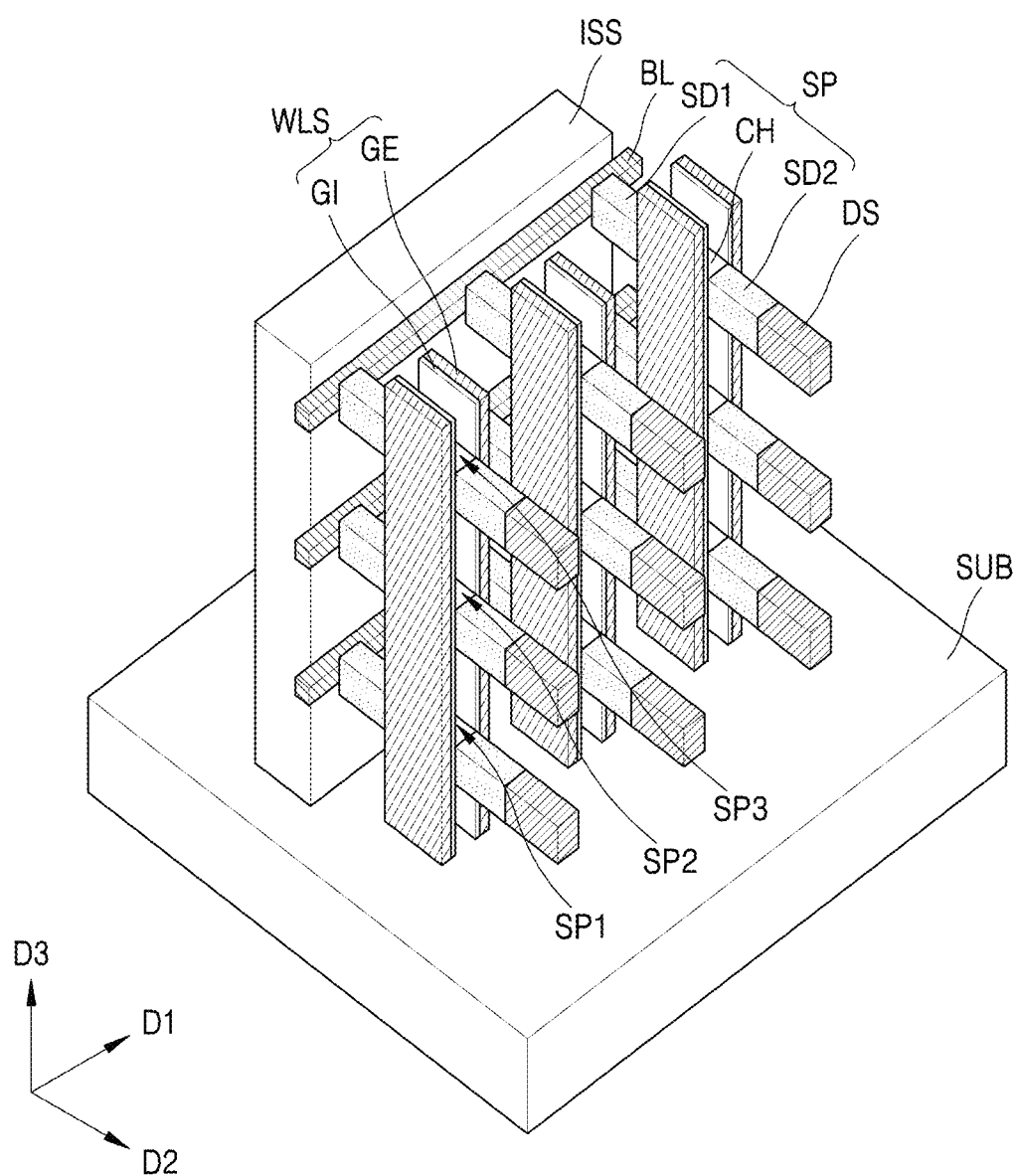
FIG. 2 is a perspective view of a semiconductor memory device according to an embodiment.

FIG. 2 is a perspective view of a semiconductor memory device according to an embodiment.

Referring to FIGS. 1 and 2, one of the sub cell arrays SCA described with reference to FIG. 1 may be arranged on a substrate SUB. The substrate SUB may include a semiconductor material, such as a Group IV semiconductor material, a Group III-V semiconductor material, a Group II-VI semiconductor material, or a combination thereof. The Group IV semiconductor material may include, for example, silicon (Si) or germanium (Ge). The Group III-V semiconductor material may include, for example, gallium arsenide (GaAs), indium phosphide (InP), gallium phosphide (GaP), indium arsenide (InAs), indium antimonide (InSb), or indium gallium arsenide (InGaAs). The Group II-VI semiconductor material may include, for example, zinc telluride (ZnTe) or cadmium sulfide (CdS).

Each sub cell array SCA, for example SCA in FIG. 1, may include a plurality of bit lines BL, a plurality of word line structures WLS, a plurality of semiconductor patterns SP, and a plurality of data storage elements DS. A semiconductor pattern SP and a word line structure WLS may correspond to a memory cell transistor MCT in FIG. 1. The word line structure WLS may correspond to a word line WL in FIG. 1.

The semiconductor patterns SP may be separated from each other in the first horizontal direction D1 and the vertical direction D3. Each of the semiconductor patterns SP may have a bar or pillar shape extending in the second horizontal direction D2. The semiconductor patterns SP may include a monocrystalline semiconductor material, e.g., monocrystalline Si, monocrystalline Ge, or monocrystalline silicon germanium (SiGe). The crystal orientation of one of the semiconductor patterns SP may be different from the crystal orientation of another one of the semiconductor patterns SP.

For example, the semiconductor patterns SP may include a first semiconductor pattern SP1 and a second semiconductor pattern SP2, which are separated from each other in the vertical direction D3, and the crystal orientation of the first semiconductor pattern SP1 may be different from the crystal orientation of the second semiconductor pattern SP2. The semiconductor patterns SP may further include a third semiconductor pattern SP3, and the third semiconductor pattern SP3 may be separated from the second semiconductor pattern SP2 in the vertical direction D3. The crystal orientation of the third semiconductor pattern SP3 may be the same as the crystal orientation of the first semiconductor pattern SP1 or the second semiconductor pattern SP2 or may be different from the crystal orientation of the first semiconductor pattern SP1 and the crystal orientation of the second semiconductor pattern SP2.

Each of the semiconductor patterns SP may include a channel region CH and a first source/drain region SD1 and a second source/drain region SD2, which are respectively at opposite ends of the channel region CH. In other words, the first source/drain region SD1 and the second source/drain region SD2 may be separated from each other in the second horizontal direction D2. Each of the first and second source/drain regions SD1 and SD2 may be doped with n- or p-type impurities. The second source/drain region SD2 of each of the semiconductor patterns SP may be connected to a data storage element DS.

Each of the bit lines BL may extend in the first horizontal direction D1. The bit lines BL may be separated from each other in the vertical direction D3. Respective first source/drain regions SD1 of a plurality of semiconductor patterns SP separated from each other in the first horizontal direction D1 may be electrically connected to the same bit line BL. Respective first source/drain regions SD1 of a plurality of semiconductor patterns SP separated from each other in the vertical direction D3 may be electrically connected to different bit lines BL, respectively. The bit lines BL may include may include a conductive material, e.g., doped Si, doped Ge, nitride titanium (TiN), nitride tantalum (TaN), tungsten (W), titanium (Ti), tantalum (Ta), copper (Cu), aluminum (Al), silver (Ag), gold (Au), tungsten silicide (WSi), cobalt silicide (CoSi), titanium silicide (TiSi), or a combination thereof.

Each of the word line structures WLS may extend in the vertical direction D3. The word line structures WLS may be separated from each other in the first horizontal direction D1. A plurality of semiconductor patterns SP separated from each other in the vertical direction D3 may be in contact with the same word line structure WLS. The word line structure WLS may be in contact with opposite side surfaces of each of the semiconductor patterns SP separated from each other in the vertical direction D3. For example, the word line structure WLS may be in contact with opposite side surfaces of each of the first through third semiconductor patterns SP1 through SP3. A plurality of semiconductor patterns SP separated from each other in the first horizontal direction D1 may be in contact with different word line structures WLS, respectively.

Each word line structure WLS may include a gate electrode GE and a gate insulating layer GI between the gate electrode GE and the channel region CH. The gate electrode GE may include a conductive material, e.g., doped Si, doped Ge, TiN, TaN, W, Ti, Ta, Cu, Al, Ag, Au, WSi, CoSi, TiSi, or a combination thereof. The gate insulating layer GI may include a high-k dielectric material, silicon oxide ($SiO_2$), silicon nitride (SiN), silicon oxynitride (SiON), or a combination thereof. The high-k dielectric material may include hafnium oxide (HfO$_2$), hafnium silicon oxide (HfSiO$_2$), lanthanum oxide (LaO), zirconium oxide (ZrO$_2$), zirconium silicon oxide (ZrSiO$_2$), tantalum oxide (Ta$_2$O$_5$), titanium oxide (TiO$_2$), barium strontium titanium oxide (BaSrTiO$_3$), barium titanium oxide (BaTiO$_3$), strontium titanium oxide (SrTiO$_3$), lithium oxide (Li$_2$O), aluminum oxide (Al$_2$O$_3$), lead scandium tantalum oxide (PbScTaO), lead zinc niobate (PbZnNbO$_3$), or a combination thereof.

An insulating structure ISS contacting the bit lines BL may be arranged on the substrate SUB. The insulating structure ISS may include SiO$_2$, SiN, SiON, or a combination thereof.

Figure 3:
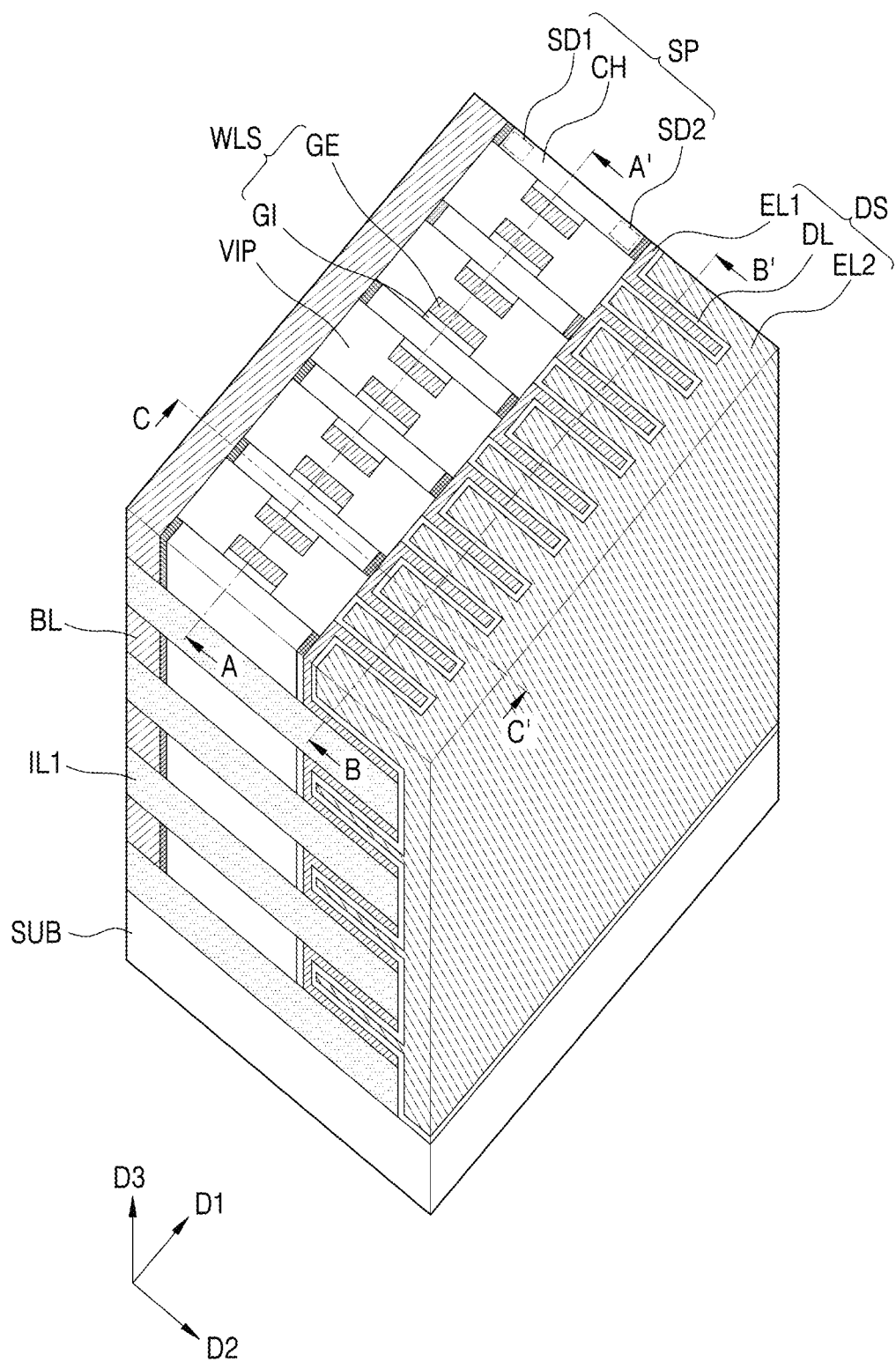
FIG. 3 is a perspective view of a semiconductor memory device according to an embodiment.
Figure 4A:
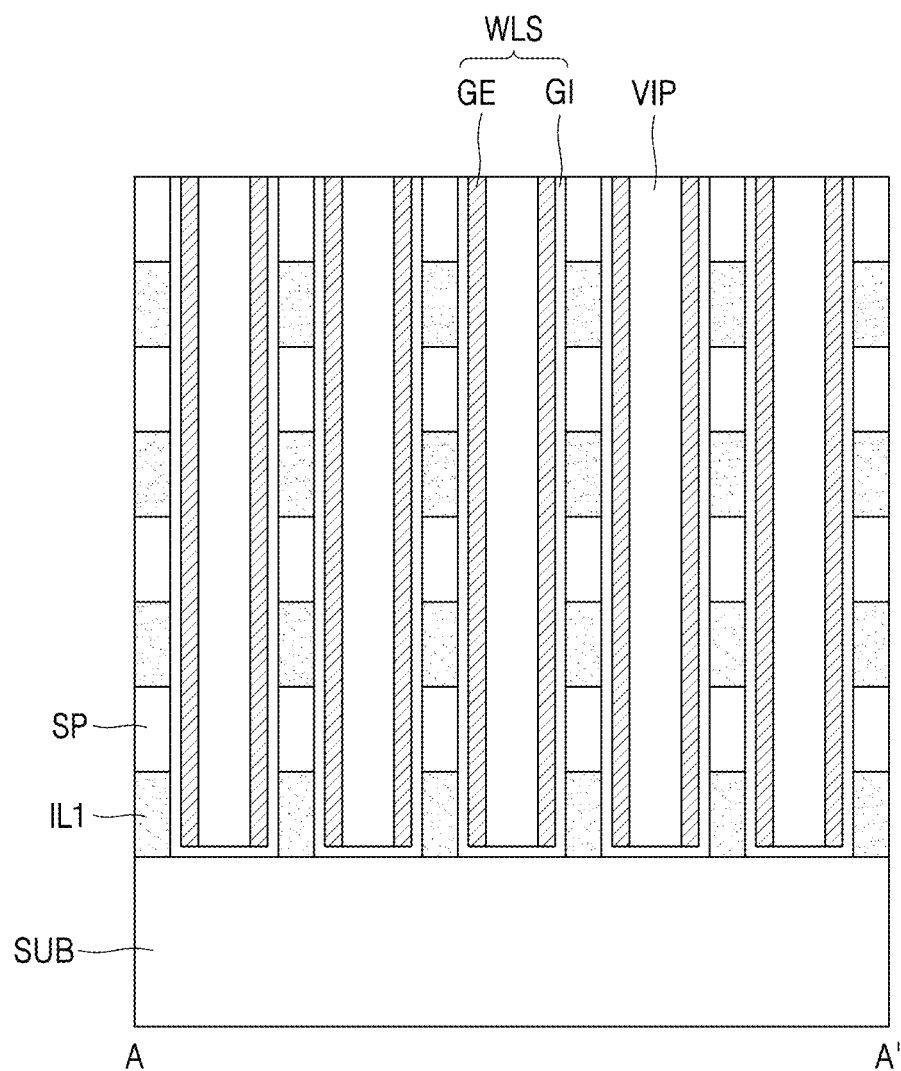
FIGS. 4A through 4C are cross-sectional views respectively taken along lines A-A', B-B', and C-C' in FIG. 3.
Figure 4B:
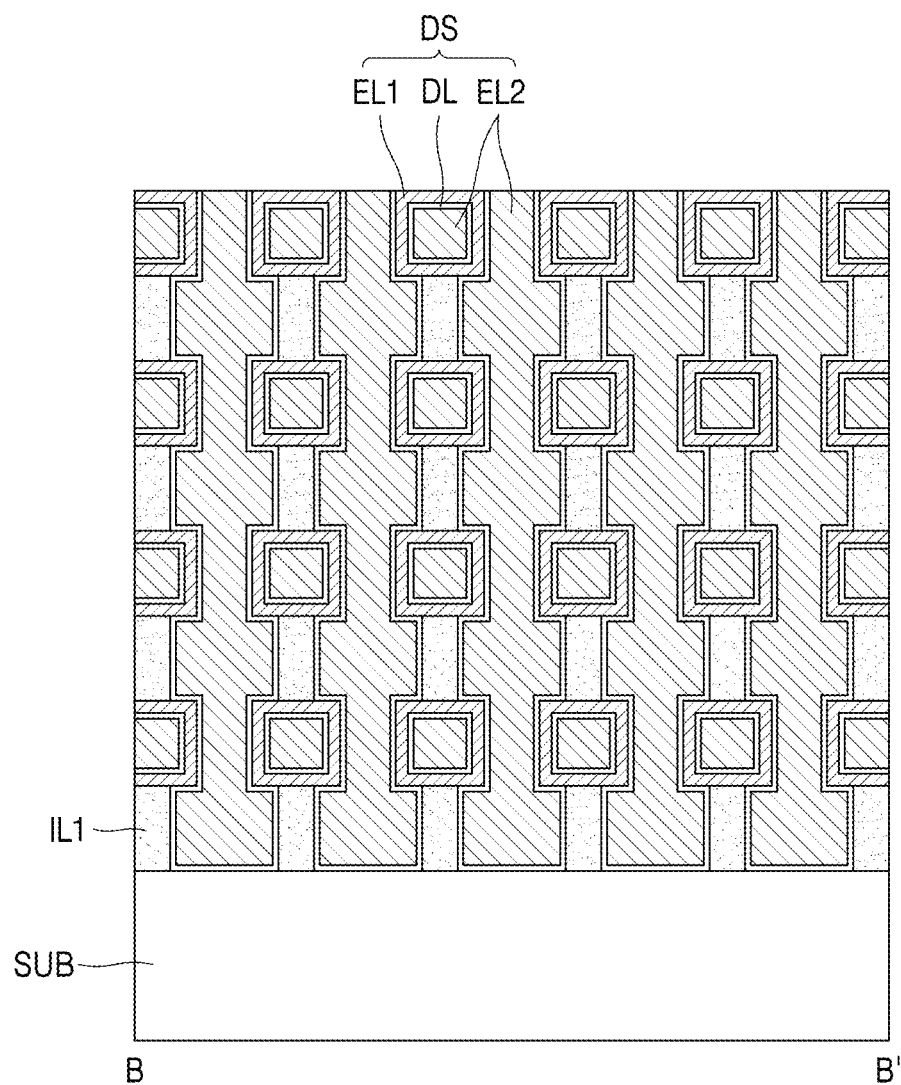
Figure 4C:
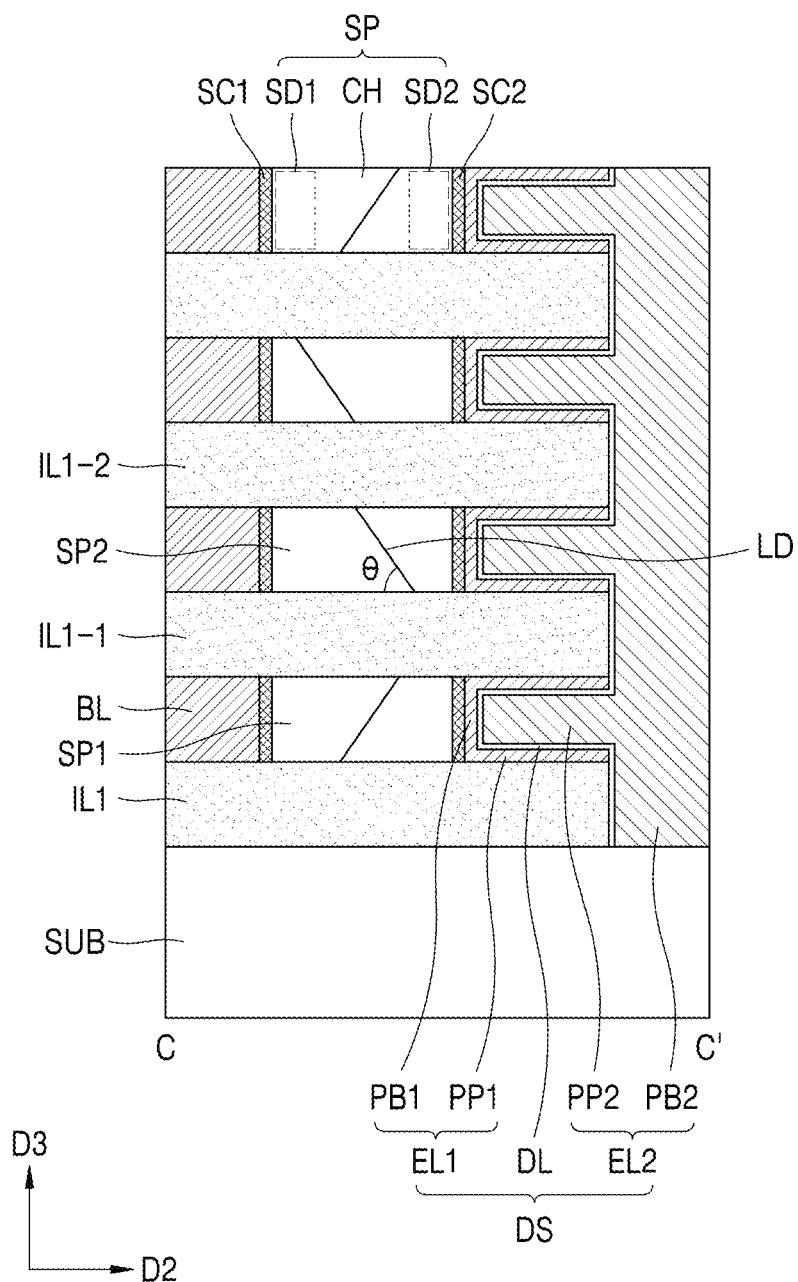

FIG. 3 is a perspective view of a semiconductor memory device according to an embodiment. FIGS. 4A through 4C are cross-sectional views respectively taken along lines A-A', B-B', and C-C' in FIG. 3, according to embodiments. Differences between the semiconductor memory device of FIG. 2 and the semiconductor memory device of FIGS. 3 through 4C will be described below.

Referring to FIGS. 3 through 4C, a plurality of first insulating layers IL1 may separate a plurality of semiconductor patterns SP from each other in the vertical direction D3. In other words, the first insulating layers IL1 may alternate with the semiconductor patterns SP. A plurality of bit lines BL may be arranged among the first insulating layers IL1. In other words, the first insulating layers IL1 may alternate with the bit lines BL. The first insulating layers IL1 may include SiO$_2$, SiN, SiON, or a combination thereof.

A vertical insulating layer VIP may be between two adjacent semiconductor patterns SP in the first horizontal direction D1. The vertical insulating layer VIP may extend in the vertical direction D3. The vertical insulating layer VIP may be between two adjacent word line structures WLS in the first horizontal direction D1. The vertical insulating layer VIP may include SiO$_2$, SiN, SiON, or a combination thereof.

In some embodiments, a first silicide pattern SC1 may be between a bit line BL and a semiconductor pattern SP. The bit line BL may be electrically connected to a first source/drain region SD1 through the first silicide pattern SC1. The first silicide pattern SC1 may include metal silicide.

Each data storage element DS may include a first electrode EL1 connected to a second source/drain region SD2, a second electrode EL2 on the first electrode EL1, and a dielectric layer DL between the first electrode EL1 and the second electrode EL2. The data storage elements DS may share one dielectric layer DL and one second electrode EL2 with each other. In other words, a plurality of first electrodes EL1, one dielectric layer DL, and one second electrode EL2 may form the data storage elements DS. The first electrodes EL1 may be arranged among the first insulating layers IL1.

Each of the first electrodes EL1 may include a first base PB1 electrically connected to the second source/drain region SD2 and a first protrusion PP1 protruding from the first base PB1 in the second horizontal direction D2. The first base PB1 and the first protrusion PP1 may define an inner space. The second electrode EL2 may include a second base PB2 and a plurality of second protrusions PP2 protruding from the second base PB2 in an opposite direction to the second horizontal direction D2. Each of the second protrusions PP2 may be in the space defined by the first base PB1 and the first protrusion PP1.

Each of the first electrodes EL1 and the second electrode EL2 may include a metal material, e.g., Ti, Ta, W, Cu, Al, TiN, TaN, doped Si, doped Ge, or a combination thereof. The dielectric layer DL may include a high-k dielectric material, e.g., HfO$_2$, HfSiO$_2$, LaO, ZrO$_2$, ZrSiO$_2$, Ta$_2$O$_5$, TiO$_2$, BaSrTiO$_3$, BaTiO$_3$, SrTiO$_3$, Li$_2$O, Al$_2$O$_3$, PbScTaO, PbZnNbO$_3$, or a combination thereof.

A second silicide pattern SC2 may be between a semiconductor pattern SP and a first electrode E1. The first electrode EL1 may be electrically connected to the second source/drain region SD2 through the second silicide pattern SC2. The second silicide pattern SC2 may include metal silicide.

The semiconductor patterns SP may be monocrystalline. The crystal orientation of at least one of the semiconductor patterns SP may be different from the crystal orientation of another one of the semiconductor patterns SP. Referring to FIG. 4C, at least one of the semiconductor patterns SP may include a lattice defect LD, which extends oblique to a bottom or top surface of the at least one of the semiconductor patterns SP. For example, the semiconductor patterns SP may include the first semiconductor pattern SP1 and the second semiconductor pattern SP2, which are separated from each other in the vertical direction D3. At least one of the first semiconductor pattern SP1 and the second semiconductor pattern SP2 may include the lattice defect LD. The lattice defect LD may appear as a straight line on a cross-section of the semiconductor memory device, taken in a direction perpendicular to the first horizontal direction D1. An angle θ between the lattice defect LD and the top or bottom surface of the semiconductor pattern SP may be about 50 degrees to about 60 degrees. For example, the angle θ may be about 54.7 degrees.

For example, the semiconductor patterns SP may include the second semiconductor pattern SP2, and the first insulating layers IL1 may include an upper insulating layer IL1-2 on a top surface of the second semiconductor pattern SP2 and a lower insulating layer IL1-1 on a bottom surface of the second semiconductor pattern SP2. Each of the semiconductor patterns SP may have the lattice defect LD, which extends oblique to at least one of the bottom surface of the upper insulating layer IL1-2 and the top surface of the lower insulating layer IL1-1. The lattice defect LD may be in contact with at least one selected from the bottom surface of the upper insulating layer IL1-2 and the top surface of the lower insulating layer IL1-1. An angle between the lattice defect LD and at least one of the bottom surface of the upper insulating layer IL1-2 and the top surface of the lower insulating layer IL1-1 may be about 50 degrees to about 60 degrees.

FIGS. 5A through 5F are cross-sectional views for describing a method of manufacturing a stack structure used to manufacture a semiconductor memory device, according to an embodiment.

Figure 5A:
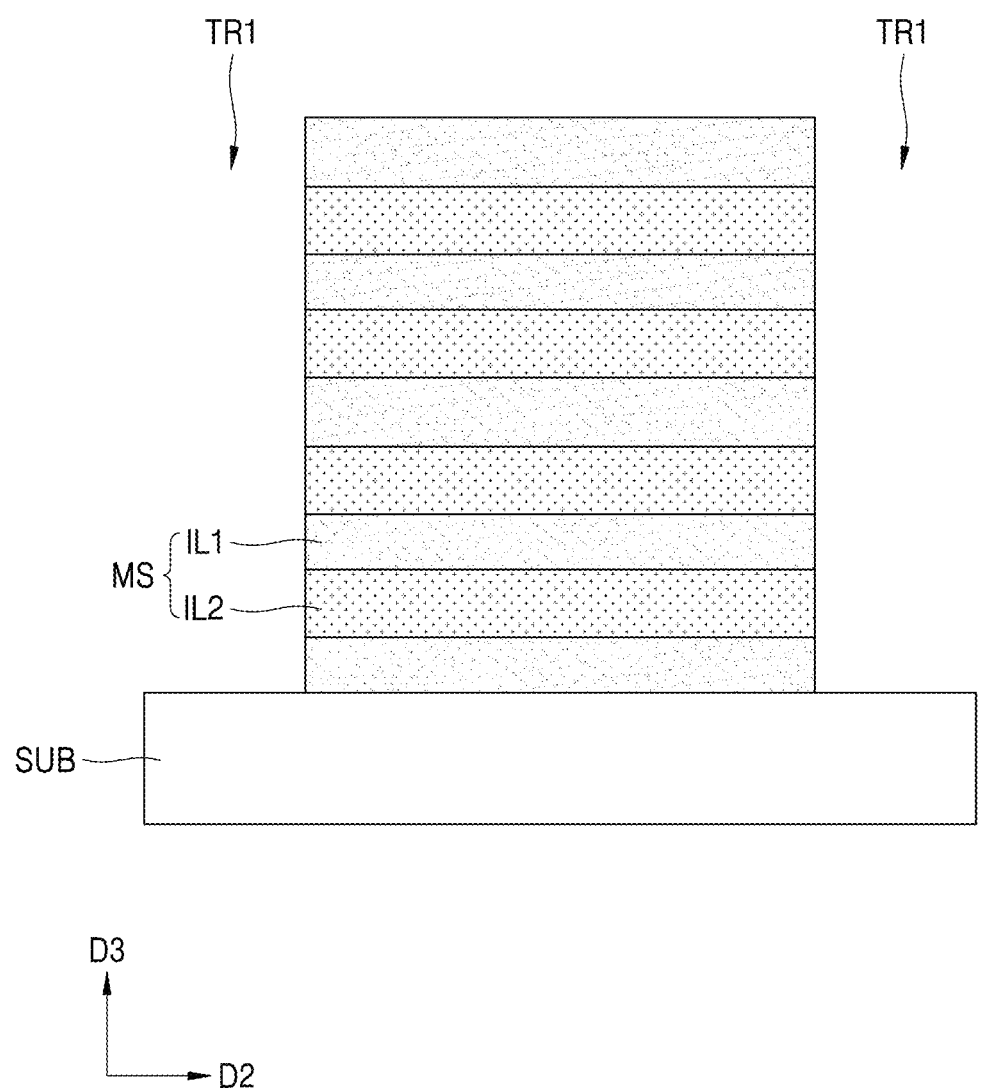
FIGS. 5A through 5F are cross-sectional views for describing a method of manufacturing a stack structure used to manufacture a semiconductor memory device, according to an embodiment.

Referring to FIG. 5A, a first mold structure MS may be formed on the substrate SUB. The first mold structure MS may be formed by alternately stacking a plurality of first insulating layers IL1 with a plurality of second insulating layers IL2 on the substrate SUB. The first insulating layers IL1 and the second insulating layers IL2 may include SiO$_2$, SiN, SiON, or a combination thereof. Each of the first insulating layers IL1 and each of the second insulating layers IL2 may have an etch selectivity with respect to each other. For example, the first insulating layers IL1 may include SiO$_2$, and the second insulating layers IL2 may include SiN.

A plurality of first trenches TR1 may be formed in the first mold structure MS. Each of the first trenches TR1 may extend in the vertical direction D3, and the first trenches TR1 may be separated from each other in the second horizontal direction D2. Although the first trenches TR1 expose the substrate SUB in FIG. 5A, the first trenches TR1 may not expose the substrate SUB in some embodiments.

Figure 5B:
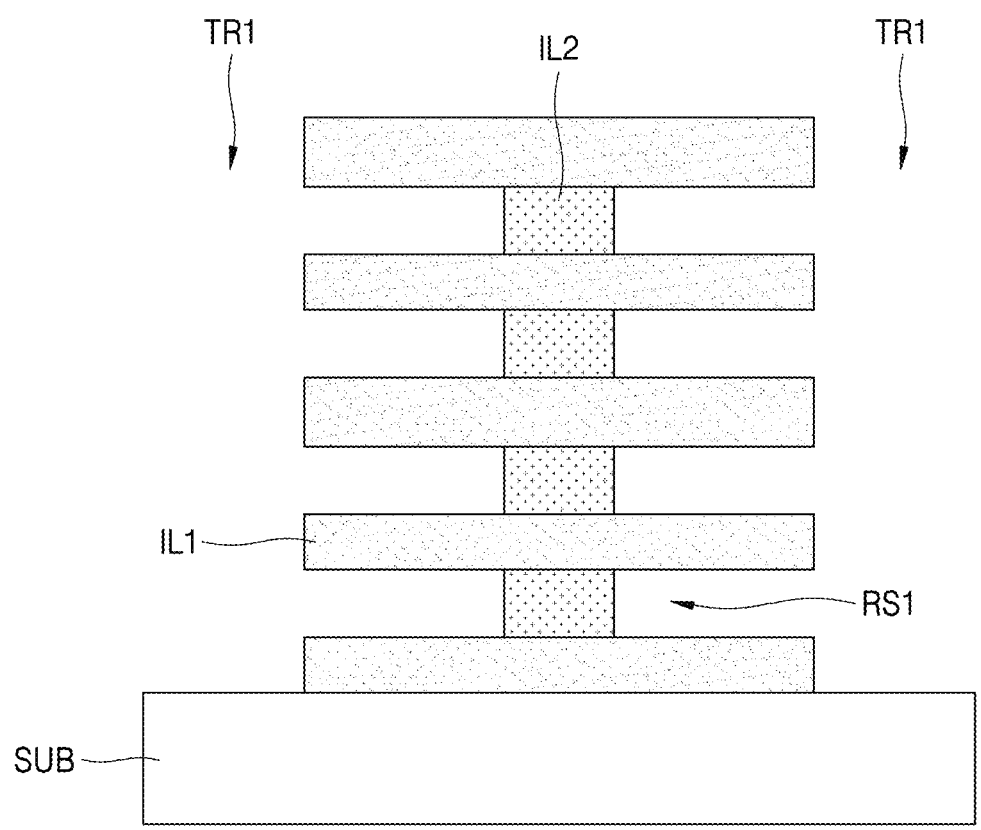

Referring to FIG. 5B, a plurality of first recesses RS1 may be formed by etching the second insulating layers IL2 in a lateral direction. For example, the first recesses RS1 may be formed by selectively wet etching the second insulating layers IL2. Each of the first recesses RS1 may be defined by two adjacent first insulating layers IL1 and a second insulating layer IL2 between the two adjacent first insulating layers IL1.

Figure 5C:
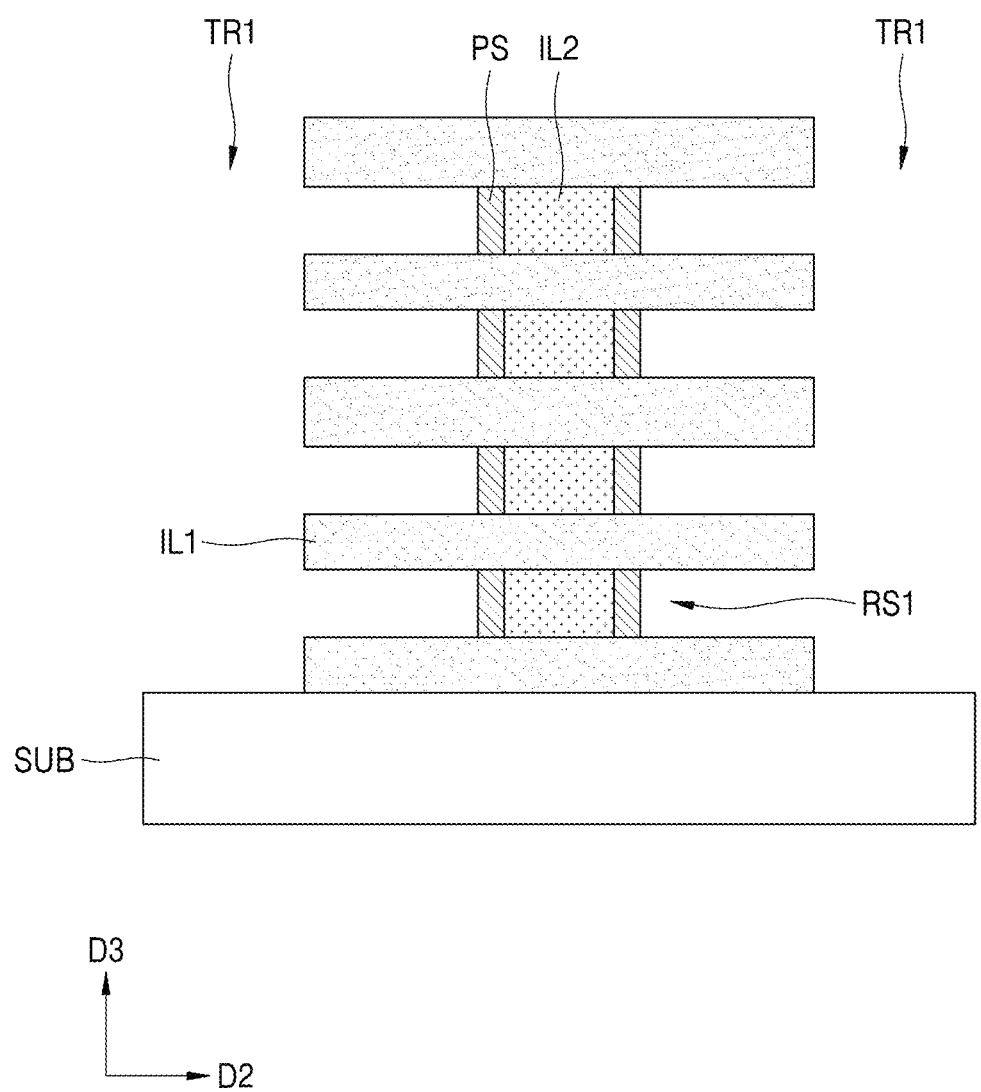

Referring to FIG. 5C, a polycrystalline semiconductor layer PS may be formed in each of the first recesses RS1. For example, the polycrystalline semiconductor layer PS may be vapor-deposited to fill each first recess RS1 and etched in the lateral direction. The polycrystalline semiconductor layer PS may be formed not by an epitaxial process but by a chemical vapor deposition (CVD) process. Accordingly, the polycrystalline semiconductor layer PS may be formed more easily compared to when a monocrystalline semiconductor seed is formed by an epitaxial process. The polycrystalline semiconductor layer PS may include a semiconductor material, e.g., Si, Ge, or SiGe.

Figure 5D:
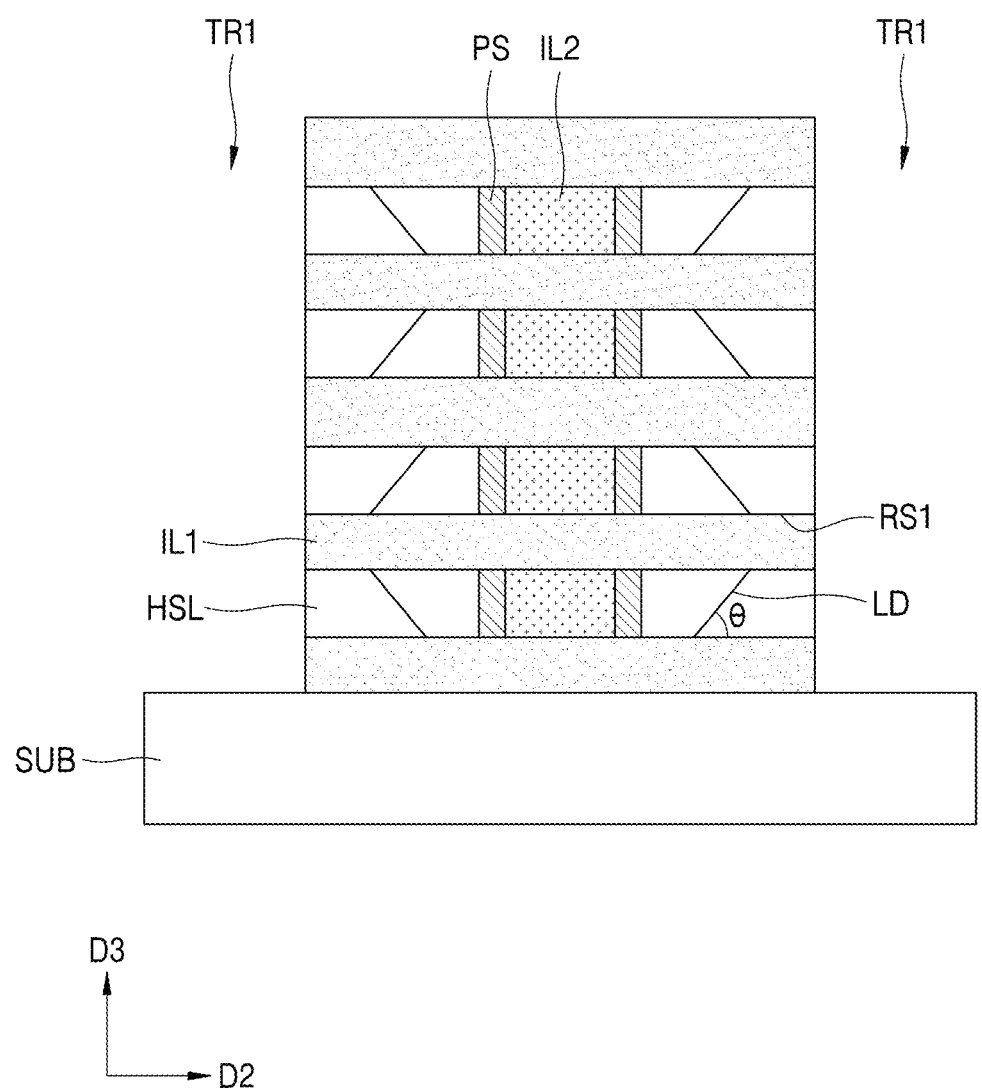

Referring to FIG. 5D, a horizontal semiconductor pattern HSL may be formed to fill each of the first recesses RS1. The horizontal semiconductor pattern HSL may be formed by epitaxial growth using the polycrystalline semiconductor layer PS as a seed. Although the seed is polycrystalline, the horizontal semiconductor pattern HSL may be grown in a monocrystalline form because the horizontal semiconductor pattern HSL is formed in a narrow space of each first recess RS1. However, because the polycrystalline semiconductor layer PS is used as a seed, horizontal semiconductor patterns HSL respectively grown from portions respectively having different crystal orientations may have different crystal orientations, respectively. The horizontal semiconductor pattern HSL may include the lattice defect LD. When the horizontal semiconductor pattern HSL grown from the polycrystalline semiconductor layer PS meets a first insulating layer ILL the lattice defect LD may be formed. The lattice defect LD may have the angle θ of about 50 degrees to about 60 degrees with respect to the second horizontal direction D2.

Figure 5E:
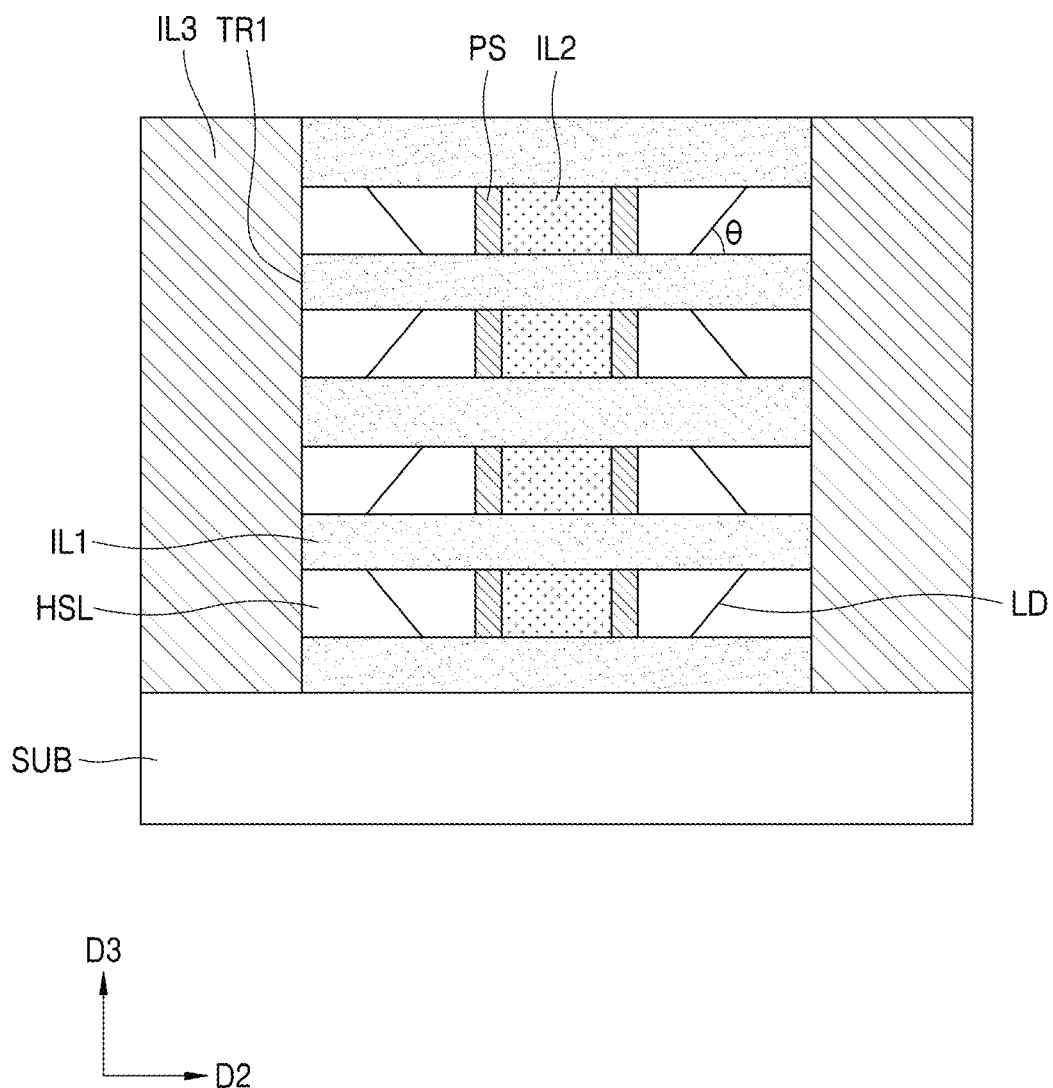

Referring to FIG. 5E, a third insulating layer IL3 may be formed to fill each of the first trenches TR1. The third insulating layer IL3 may include $SiO_2$, SiN, or SiON.

Figure 5F:
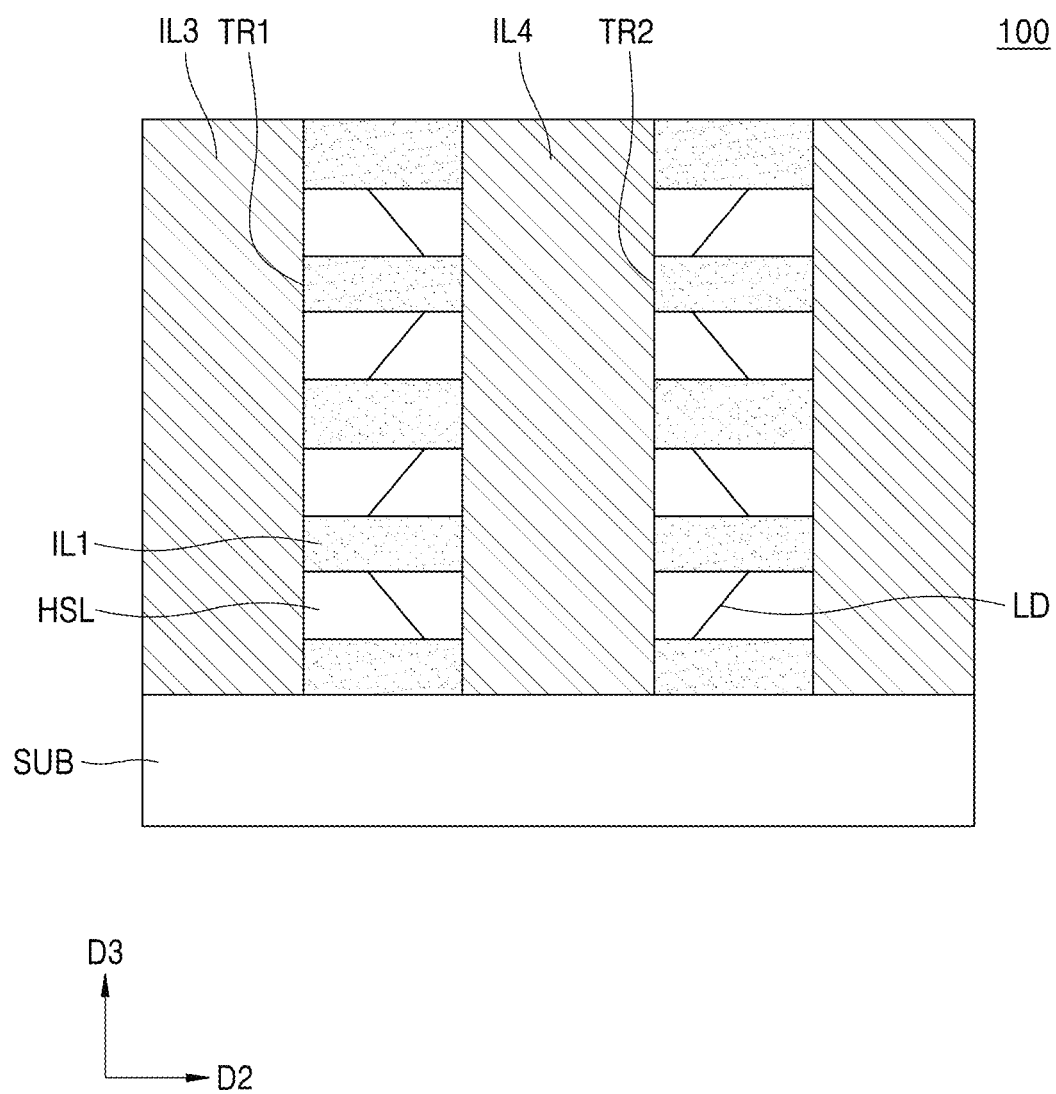

Referring to FIGS. 5E and 5F, a second trench TR2 may be formed to remove the polycrystalline semiconductor layer PS and the second insulating layer IL2. The second trench TR2 may be filled with a fourth insulating layer IL4. The fourth insulating layer IL4 may include $SiO_2$, SiN, or SiON.

As described above with reference to FIGS. 5A through 5F, a stack structure 100 used to manufacture a semiconductor memory device according to an embodiment may be manufactured. The stack structure 100 may include a plurality of first insulating layers IL1 and a plurality of horizontal semiconductor patterns HSL, which are stacked alternately with each other on the substrate SUB in the vertical direction D3. The stack structure 100 may further include a plurality of third insulating layers IL3, which pass through the stack structure 100 and are separated from each other in the second horizontal direction D2. The stack structure 100 may further include the fourth insulating layer IL4 between two adjacent third insulating layers IL3. The fourth insulating layer IL4 may be separated from each of the third insulating layers IL3 in the second horizontal direction D2. The first insulating layers IL1 and the horizontal semiconductor patterns HSL may extend between the fourth insulating layer IL4 and each of the third insulating layers IL3.

FIGS. 6A through 6E are cross-sectional views for describing a method of manufacturing a stack structure used to manufacture a semiconductor memory device, according to an embodiment.

Figure 6A:
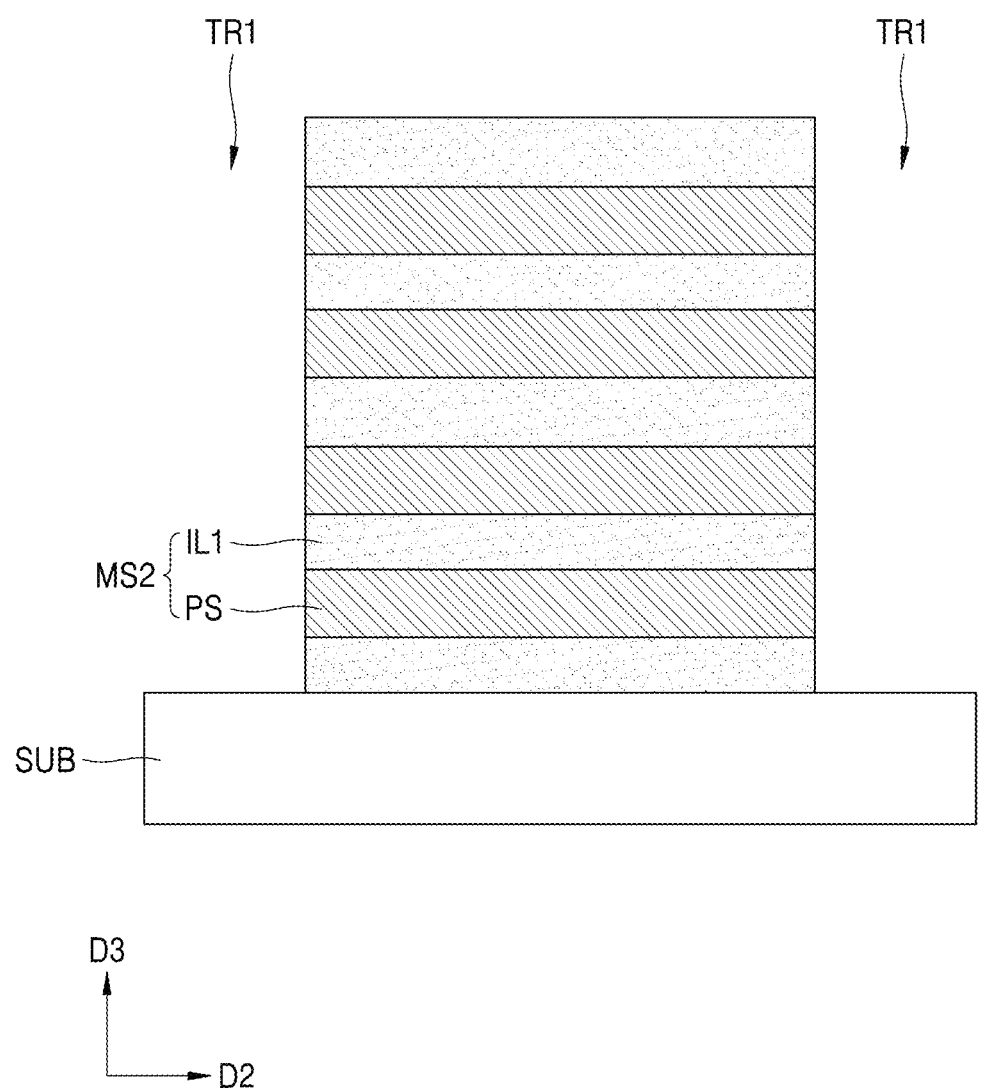
FIGS. 6A through 6E are cross-sectional views for describing a method of manufacturing a stack structure used to manufacture a semiconductor memory device, according to an embodiment.

Referring to FIG. 6A, a second mold structure MS2 may be formed on the substrate SUB. The second mold structure MS2 may be formed by alternately stacking a plurality of first insulating layers IL1 with a plurality of polycrystalline semiconductor layers PS on the substrate SUB. The polycrystalline semiconductor layers PS may include a semiconductor material, e.g., Si, Ge, or SiGe. The first insulating layers IL1 may include $SiO_2$, SiN, SiON, or a combination thereof. The polycrystalline semiconductor layers PS may be formed by a CVD process so that process cost and difficulty may be reduced.

A plurality of first trenches TR1 may be formed in the second mold structure MS2. Each of the first trenches TR1 may extend in the vertical direction D3, and the first trenches TR1 may be separated from each other in the second horizontal direction D2. Although the first trenches TR1 expose the substrate SUB in FIG. 6A, the first trenches TR1 may not expose the substrate SUB in some embodiments.

Figure 6B:
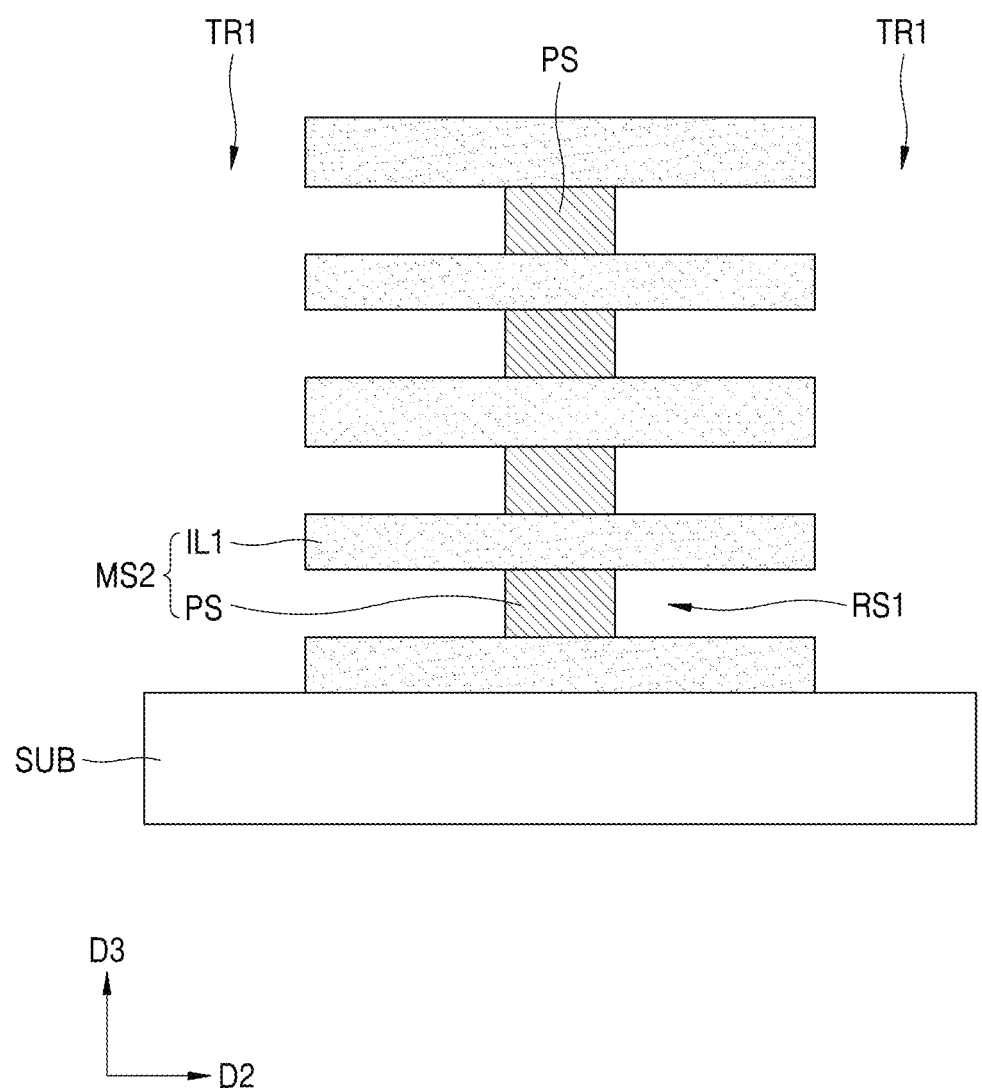

Referring to FIG. 6B, a plurality of first recesses RS1 may be formed by selectively etching the polycrystalline semiconductor layers PS in the lateral direction. Each of the first recesses RS1 may be defined by two adjacent first insulating layers IL1 and a polycrystalline semiconductor layer PS between the two adjacent first insulating layers IL1.

Figure 6C:
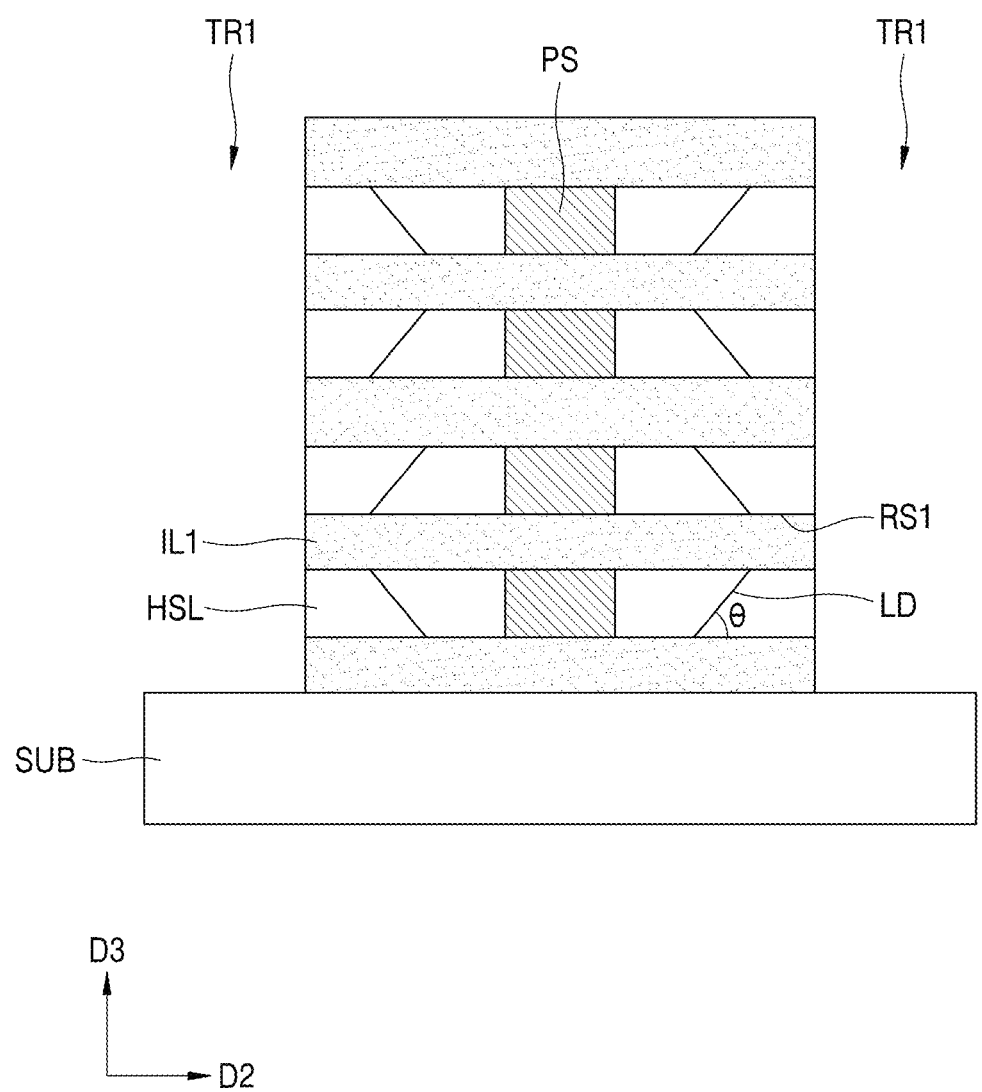

Referring to FIG. 6C, a horizontal semiconductor pattern HSL may be formed to fill each of the first recesses RS1. The horizontal semiconductor pattern HSL may be formed by epitaxial growth using the polycrystalline semiconductor layer PS as a seed. Although the seed is polycrystalline, the horizontal semiconductor pattern HSL may be grown in a monocrystalline form because the horizontal semiconductor pattern HSL is formed in a narrow space of each first recess RS1. However, because the polycrystalline semiconductor layer PS is used as a seed, horizontal semiconductor patterns HSL respectively grown from portions respectively having different crystal orientations may have different crystal orientations, respectively. The horizontal semiconductor pattern HSL may include the lattice defect LD. When the horizontal semiconductor pattern HSL grown from the polycrystalline semiconductor layer PS meets a first insulating layer ILL the lattice defect LD may be formed. The lattice defect LD may have the angle θ of about 50 degrees to about 60 degrees with respect to the second horizontal direction D2.

Figure 6D:
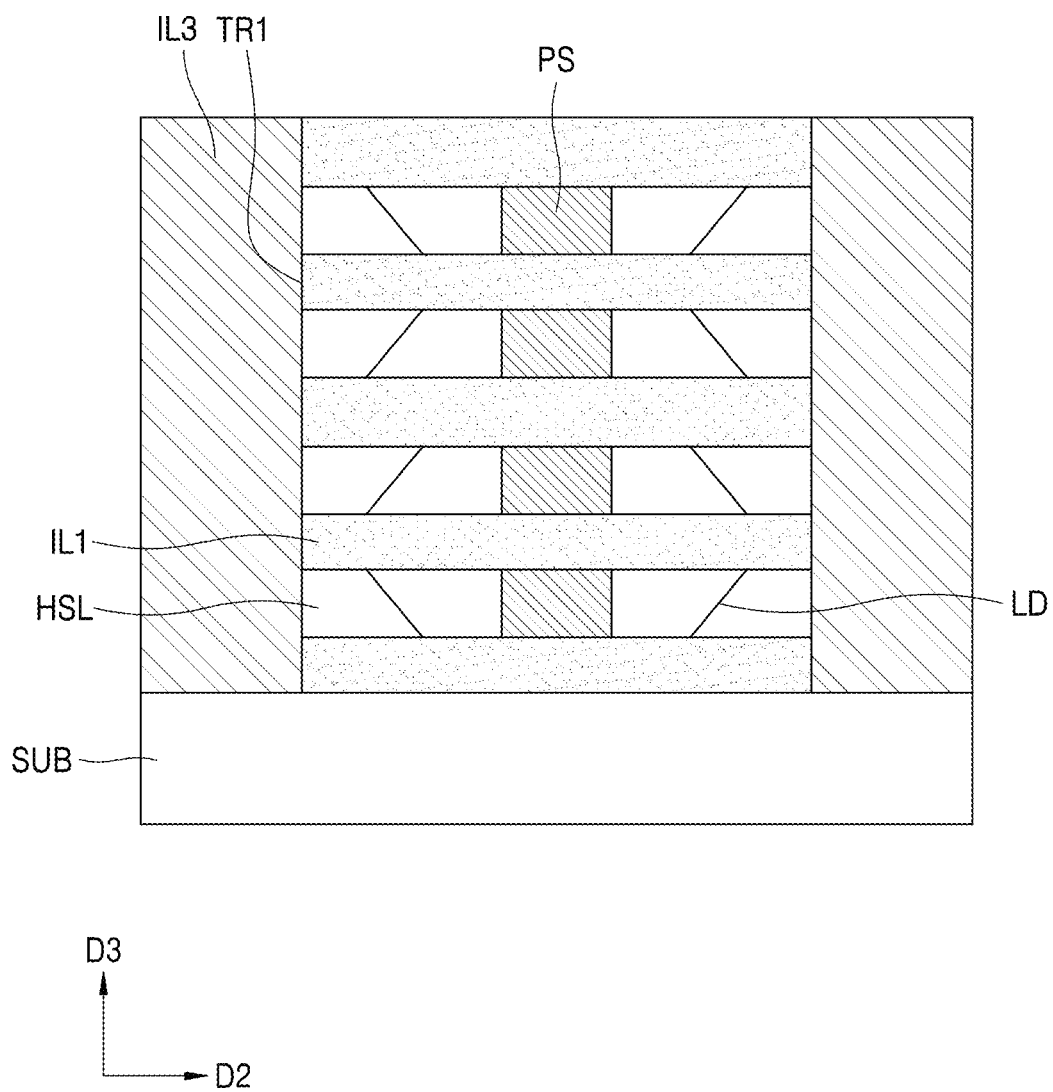

Referring to FIG. 6D, a third insulating layer IL3 may be formed to fill each of the first trenches TR1. The third insulating layer IL3 may include $SiO_2$, SiN, or SiON.

Figure 6E:
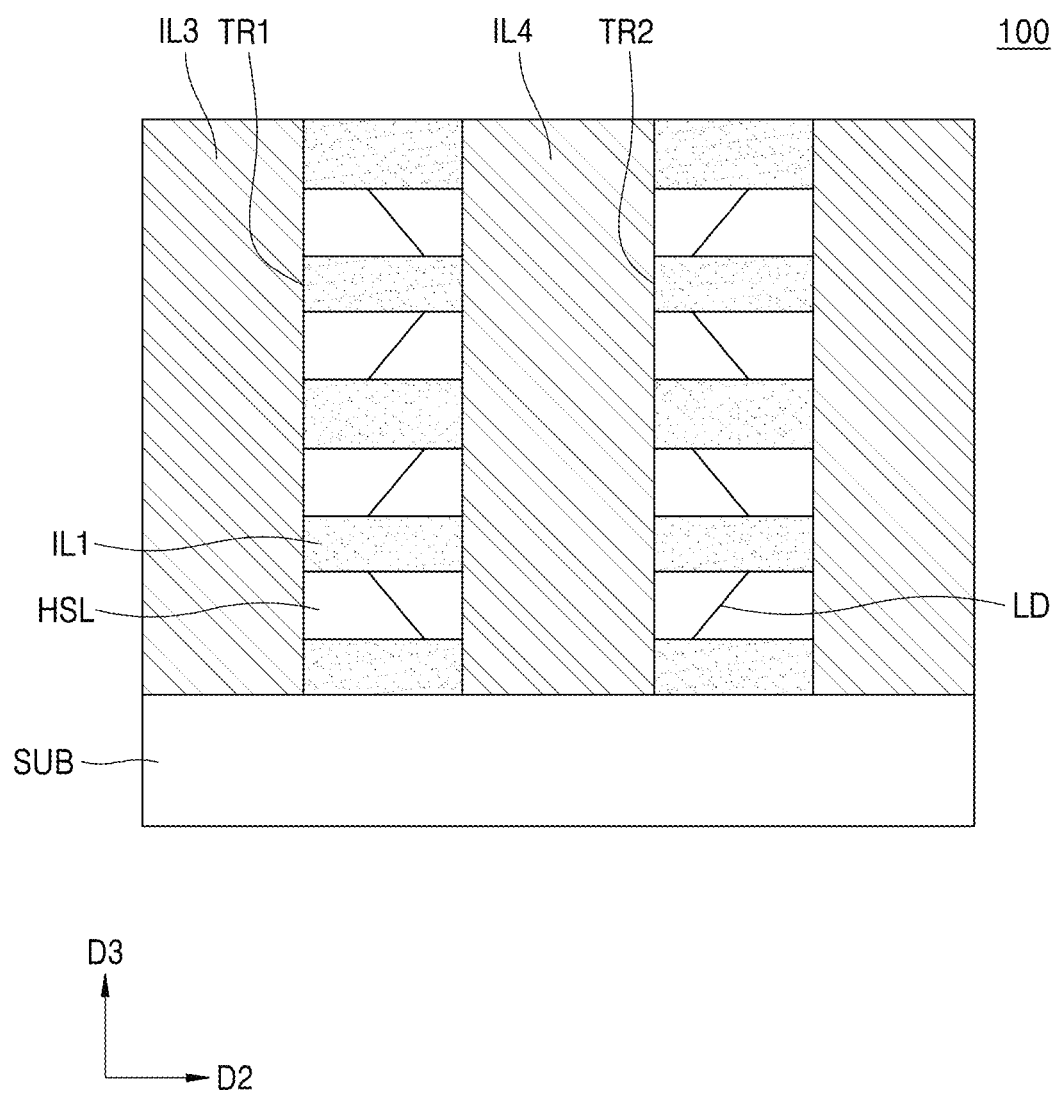

Referring to FIGS. 6D and 6E, the second trench TR2 may be formed to remove the polycrystalline semiconductor layer PS. The second trench TR2 may be filled with the fourth insulating layer IL4. As described above with reference to FIGS. 6A through 6E, the stack structure 100 used to manufacture a semiconductor memory device according to an embodiment may be manufactured.

FIGS. 7A through 7G are cross-sectional views for describing a method of manufacturing a stack structure used to manufacture a semiconductor memory device, according to an embodiment.

Figure 7A:
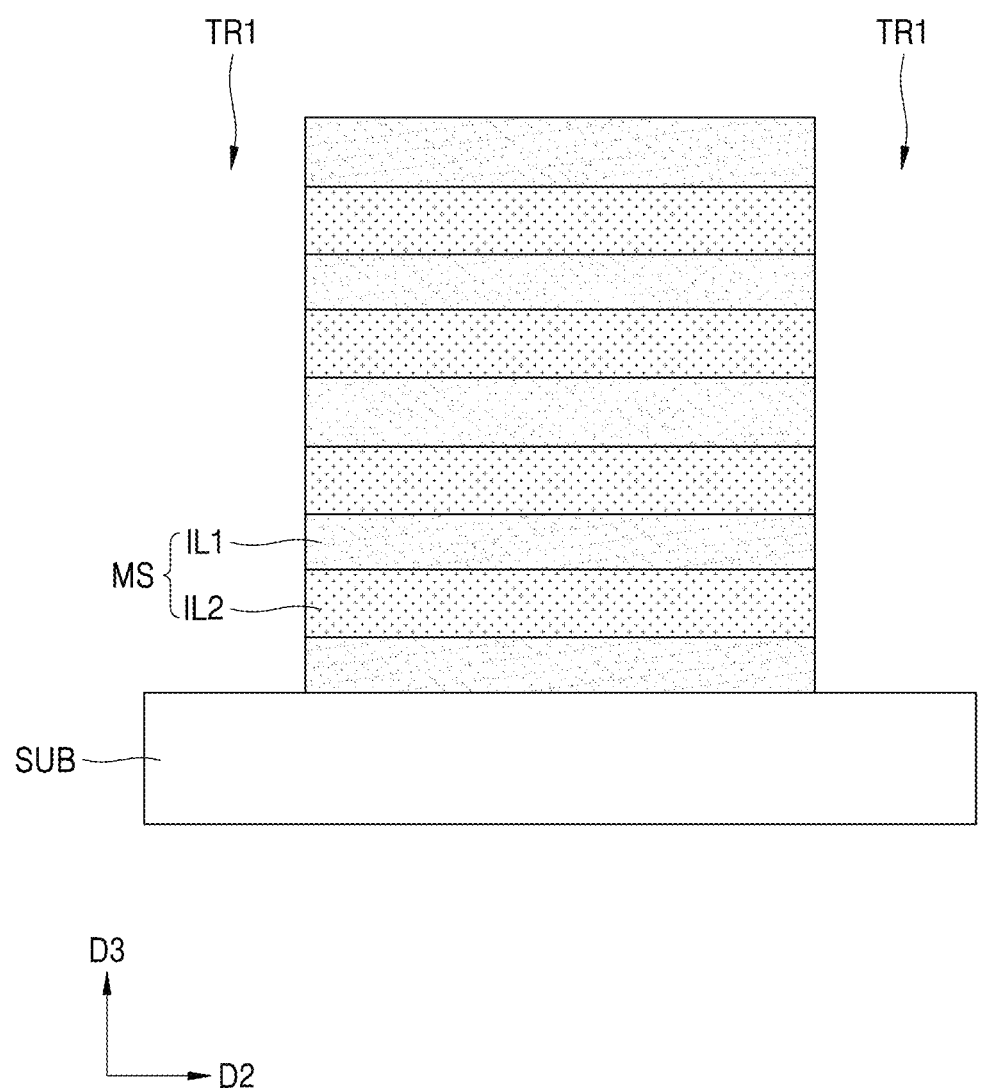
FIGS. 7A through 7G are cross-sectional views for describing a method of manufacturing a stack structure used to manufacture a semiconductor memory device, according to an embodiment.

Referring to FIG. 7A, the first mold structure MS may be formed on the substrate SUB. The first mold structure MS may be formed by alternately stacking a plurality of first insulating layers IL1 with a plurality of second insulating layers IL2 on the substrate SUB. The first insulating layers IL1 and the second insulating layers IL2 may include $SiO_2$, SiN, SiON, or a combination thereof. Each of the first insulating layers IL1 and each of the second insulating layers IL2 may have an etch selectivity with respect to each other. For example, the first insulating layers IL1 may include $SiO_2$, and the second insulating layers IL2 may include SiN.

A plurality of first trenches TR1 may be formed in the first mold structure MS. Each of the first trenches TR1 may extend in the vertical direction D3, and the first trenches TR1 may be separated from each other in the second horizontal direction D2. Although the first trenches TR1 expose the substrate SUB in FIG. 7A, the first trenches TR1 may not expose the substrate SUB in some embodiments.

Figure 7B:
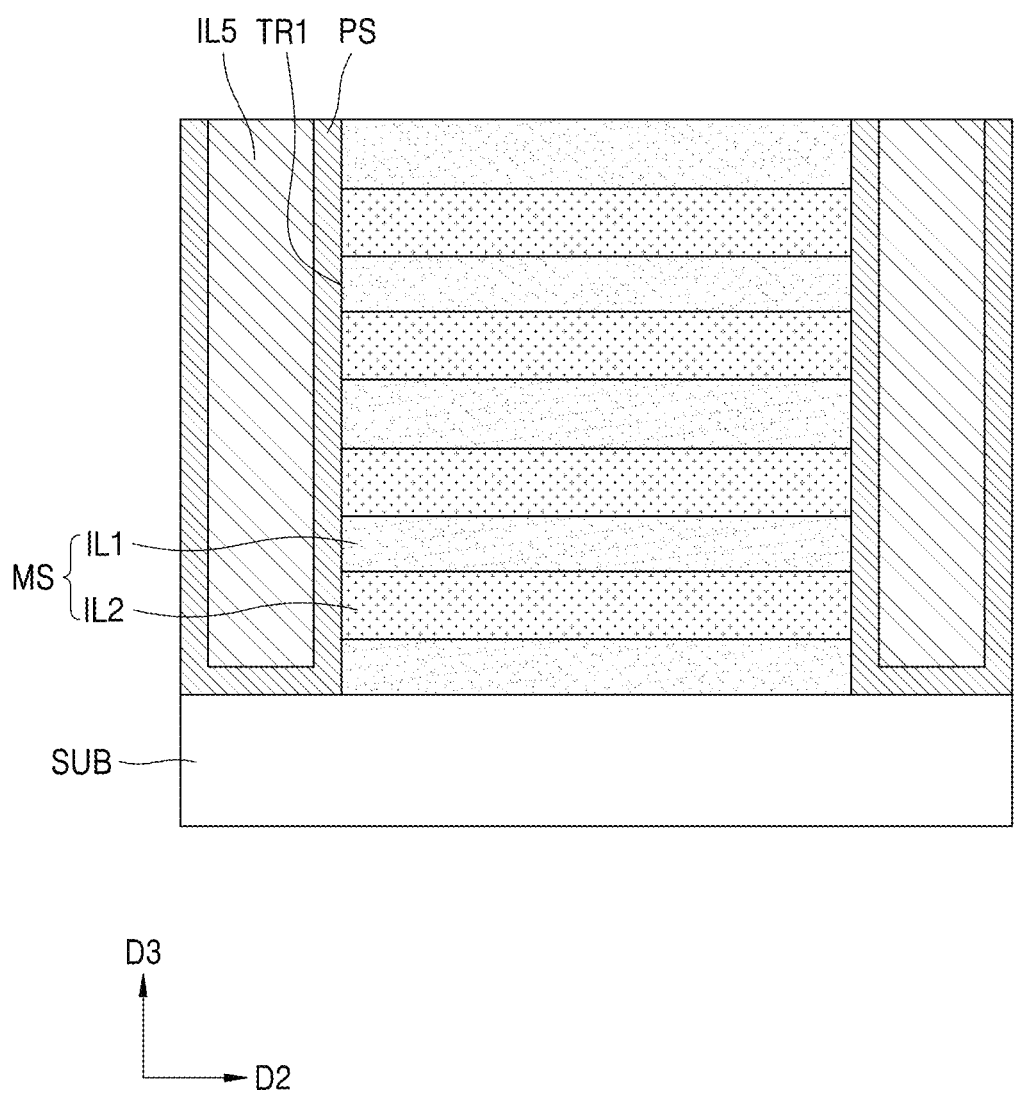

Referring to FIG. 7B, a polycrystalline semiconductor layer PS may be formed on a surface of each of the first trenches TR1. Thereafter, a fifth insulating layer IL5 may be formed on the polycrystalline semiconductor layer PS to fill each first trench TR1. The fifth insulating layer IL5 may include $SiO_2$, SiN, SiON, or a combination thereof. In some embodiments, the first trench TR1 may be filled with only the polycrystalline semiconductor layer PS. The polycrystalline semiconductor layer PS may be formed by a CVD process so that process cost and difficulty may be reduced, for example compared to an epitaxial growth process.

Figure 7C:
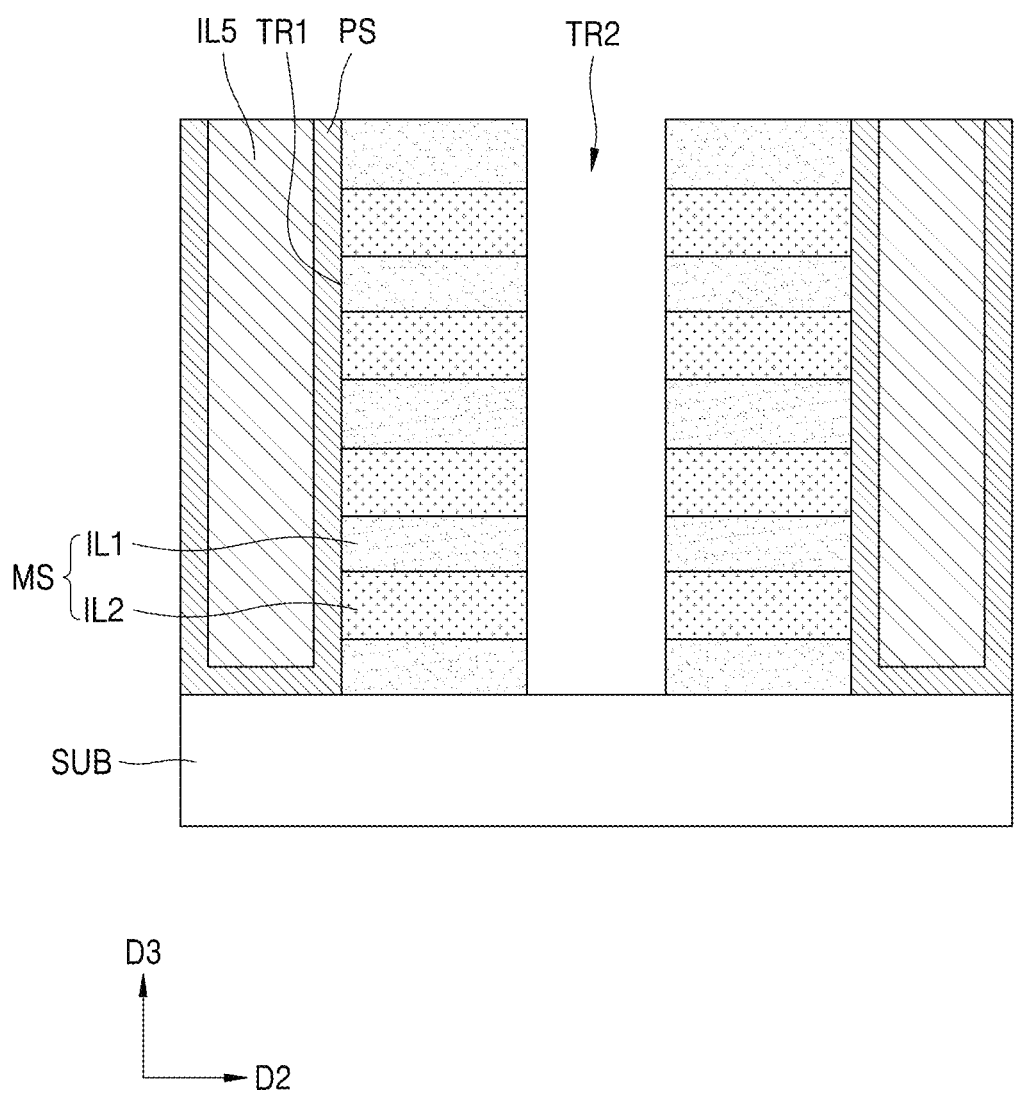

Referring to FIG. 7C, the second trench TR2 may be formed between two adjacent first trenches TR1 to pass through the mold structure MS in the vertical direction D3. Although the second trench TR2 expose the substrate SUB in FIG. 7C, the second trench TR2 may not expose the substrate SUB in some embodiments.

Figure 7D:
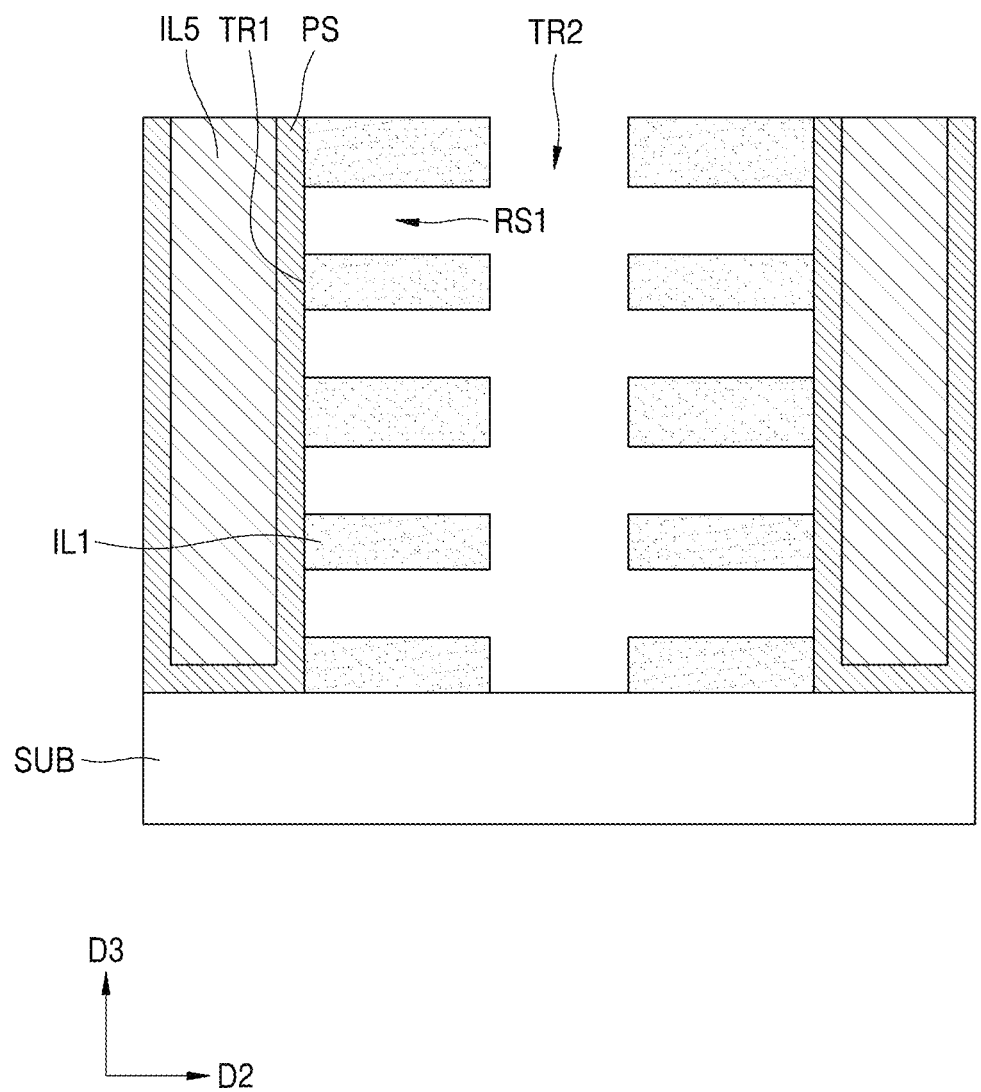

Referring to FIGS. 7C and 7D, a plurality of first recesses RS1 may be formed by removing the second insulating layers IL2. The first recesses RS1 may expose the polycrystalline semiconductor layer PS. Each of the first recesses RS1 may be defined by two adjacent first insulating layers IL1 and the polycrystalline semiconductor layer PS.

Figure 7E:
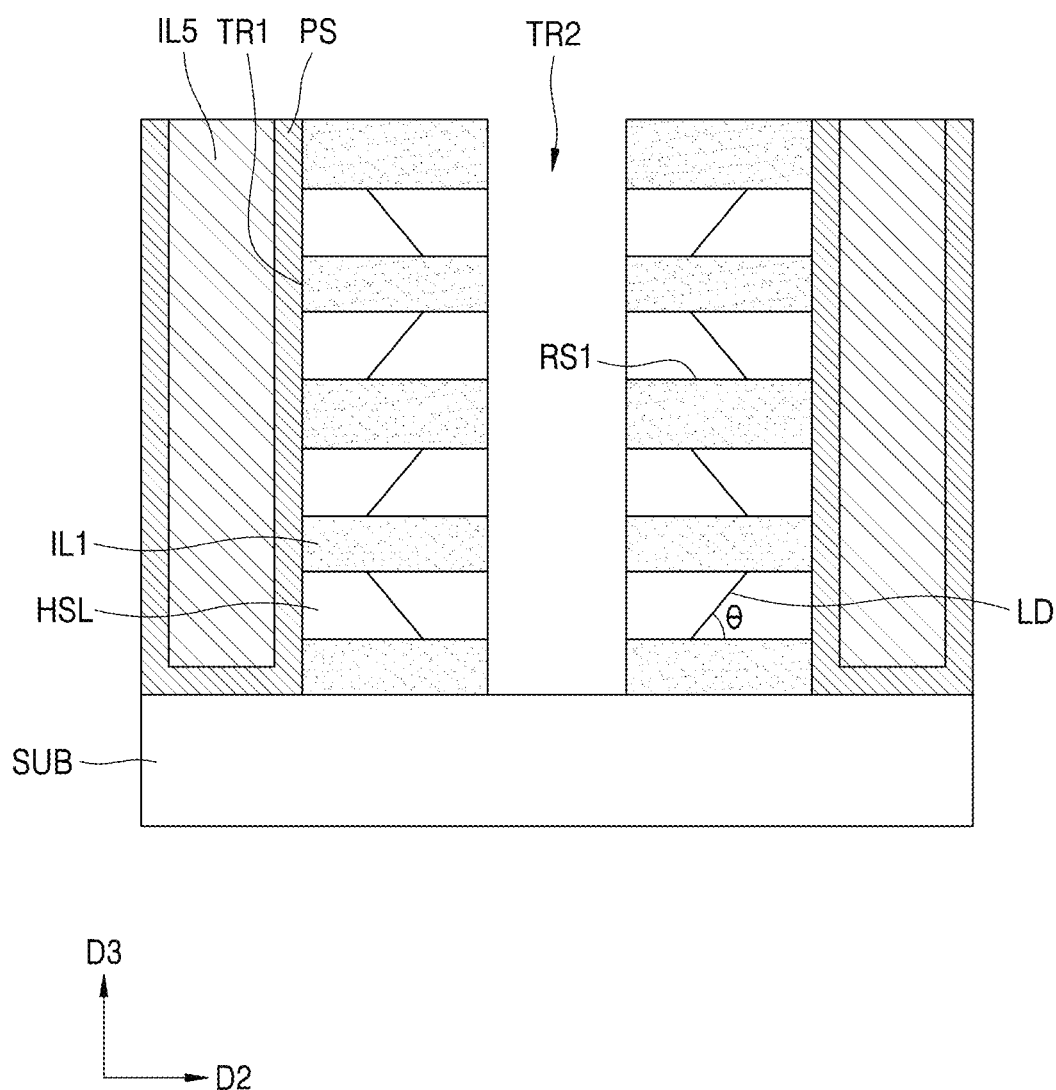

Referring to FIG. 7E, a horizontal semiconductor pattern HSL may be formed to fill each of the first recesses RS1. The horizontal semiconductor pattern HSL may be formed by epitaxial growth using the polycrystalline semiconductor layer PS as a seed. Although the seed is polycrystalline, the horizontal semiconductor pattern HSL may be grown in a monocrystalline form because the horizontal semiconductor pattern HSL is formed in a narrow space of each first recess RS1. However, because the polycrystalline semiconductor layer PS is used as a seed, horizontal semiconductor patterns HSL respectively grown from portions respectively having different crystal orientations may have different crystal orientations, respectively. The horizontal semiconductor pattern HSL may include the lattice defect LD. When the horizontal semiconductor pattern HSL grown from the polycrystalline semiconductor layer PS meets a first insulating layer ILL the lattice defect LD may be formed. The lattice defect LD may have the angle θ of about 50 degrees to about 60 degrees with respect to the second horizontal direction D2.

Figure 7F:
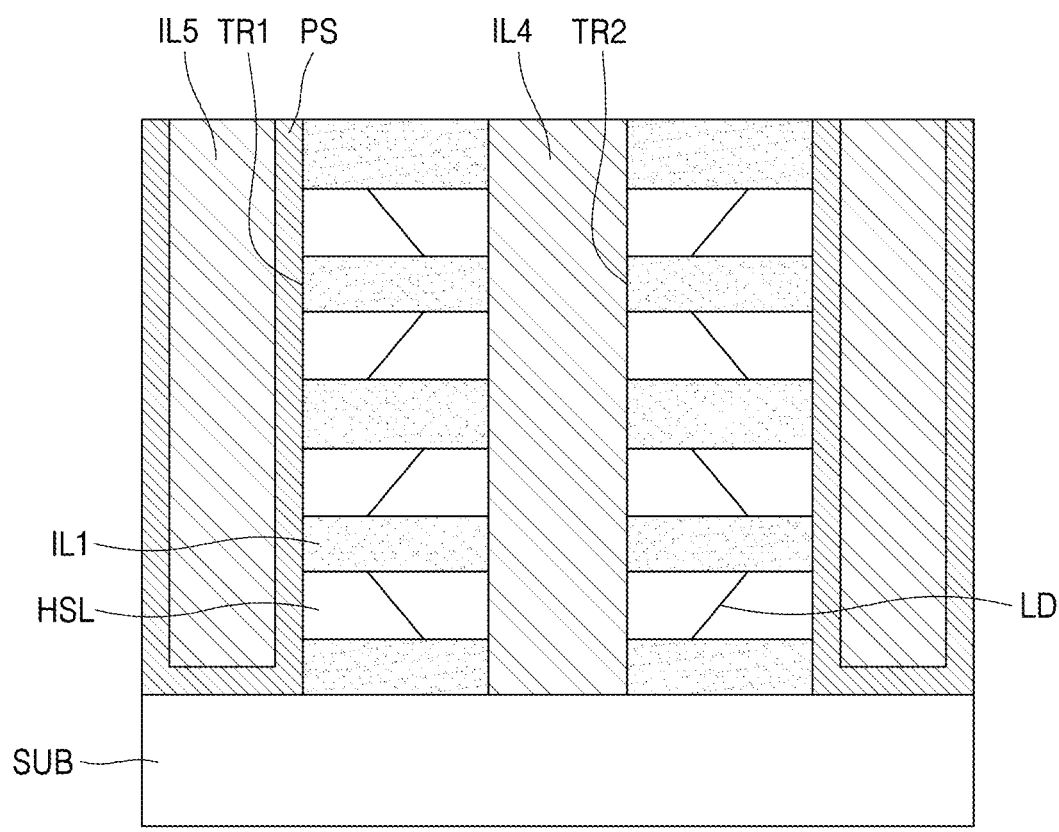

Referring to FIG. 7F, the fourth insulating layer IL4 may be formed in the second trench TR2.

Figure 7G:
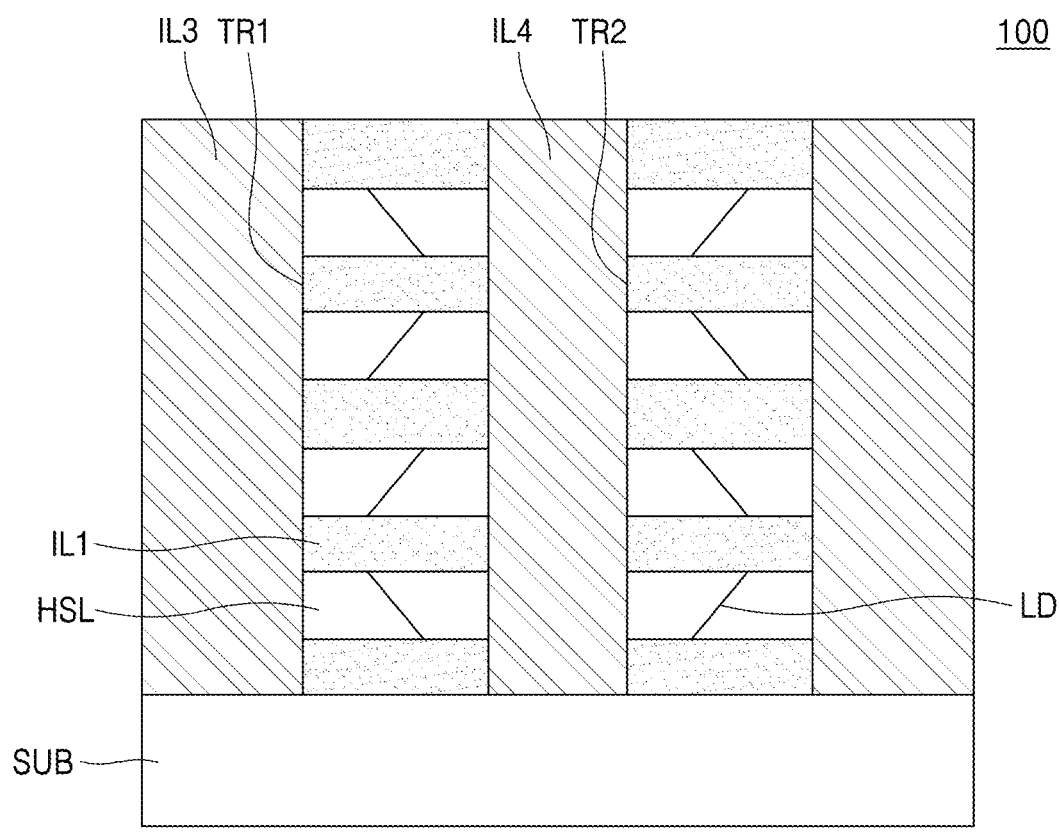

Referring to FIGS. 7F and 7G, the polycrystalline semiconductor layer PS and the fifth insulating layer IL5 may be removed from each of the first trenches TR1. Thereafter, the third insulating layer IL3 may be formed in each of the first trenches TR1. As described above with reference to FIGS. 7A through 7G, the stack structure 100 used to manufacture a semiconductor memory device according to an embodiment may be manufactured.

FIGS. 8A, 9A, 10A, 11A, 12A, 13A, and 14A illustrate planar cross-sectional views for describing a method of manufacturing a semiconductor memory device using a stack structure manufactured by the method of FIGS. 5A through 5F, FIGS. 6A through 6E, or FIGS. 7A through 7G. FIGS. 8B, 9B, 10B, 11B, 12B, 13B, and 14B illustrate cross-sectional views taken along line A-A' in FIGS. 8A, 9A, 10A, 11A, 12A, 13A, and 14A, respectively, according to embodiments. FIGS. 8C, 9C, 10C, 11C, 12C, 13C, and 14C illustrate cross-sectional views taken along line B-B' in FIGS. 8A, 9A, 10A, 11A, 12A, 13A, and 14A, respectively, according to embodiments.

Figure 8A:
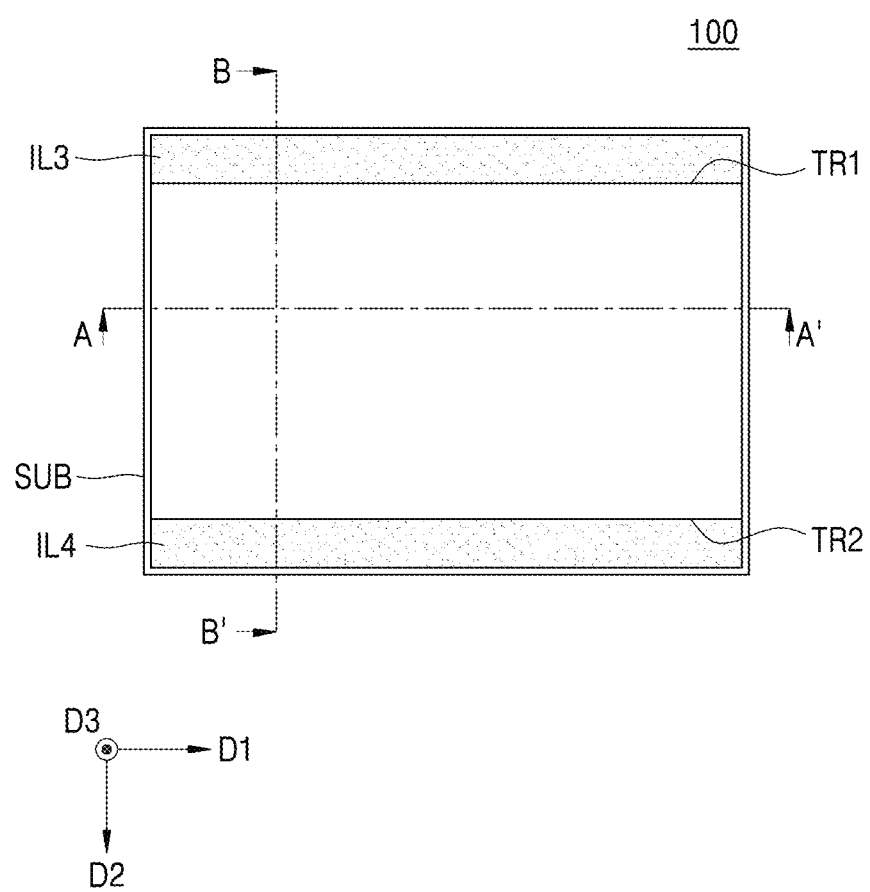
FIGS. 8A, 9A, 10A, 11A, 12A, 13A, and 14A are planar cross-sectional views for describing a method of manufacturing a semiconductor memory device using the stack structure manufactured by the method of FIGS. 5A through 5F, FIGS. 6A through 6E, or FIGS. 7A through 7G, according to embodiments.
Figure 8B:
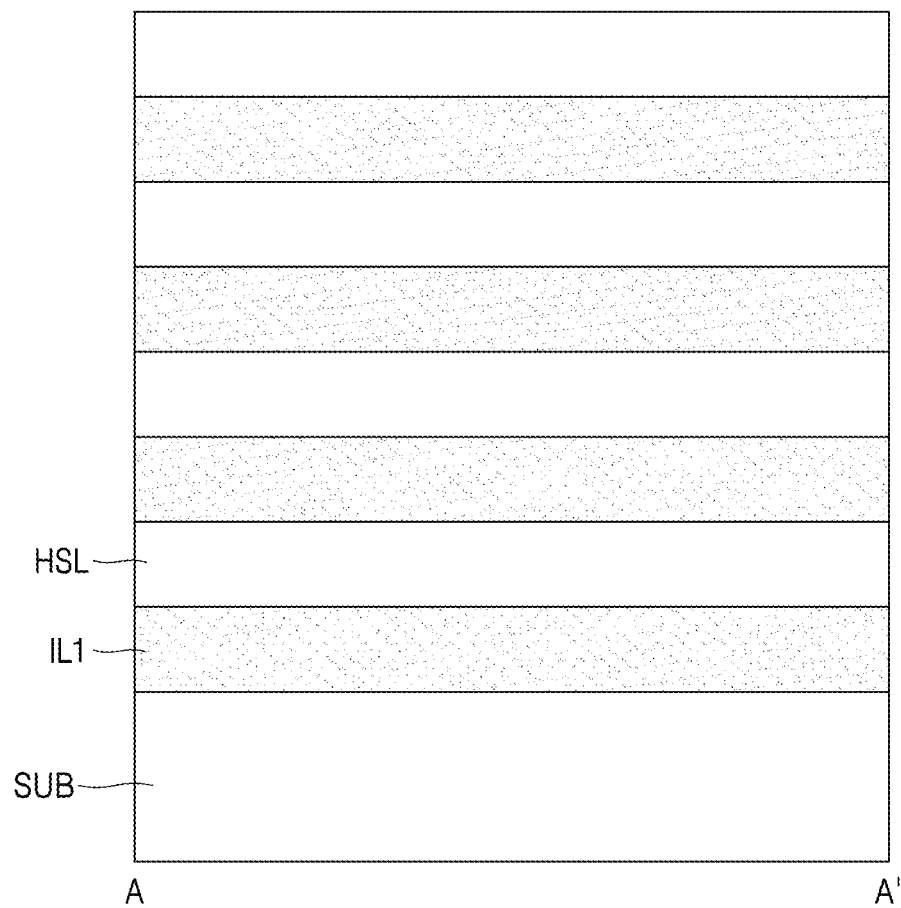
FIGS. 8B, 9B, 10B, 11B, 12B, 13B, and 14B are cross-sectional views taken along line A-A' in FIGS. 8A, 9A, 10A, 11A, 12A, 13A, and 14A, respectively, according to embodiments.
Figure 8C:
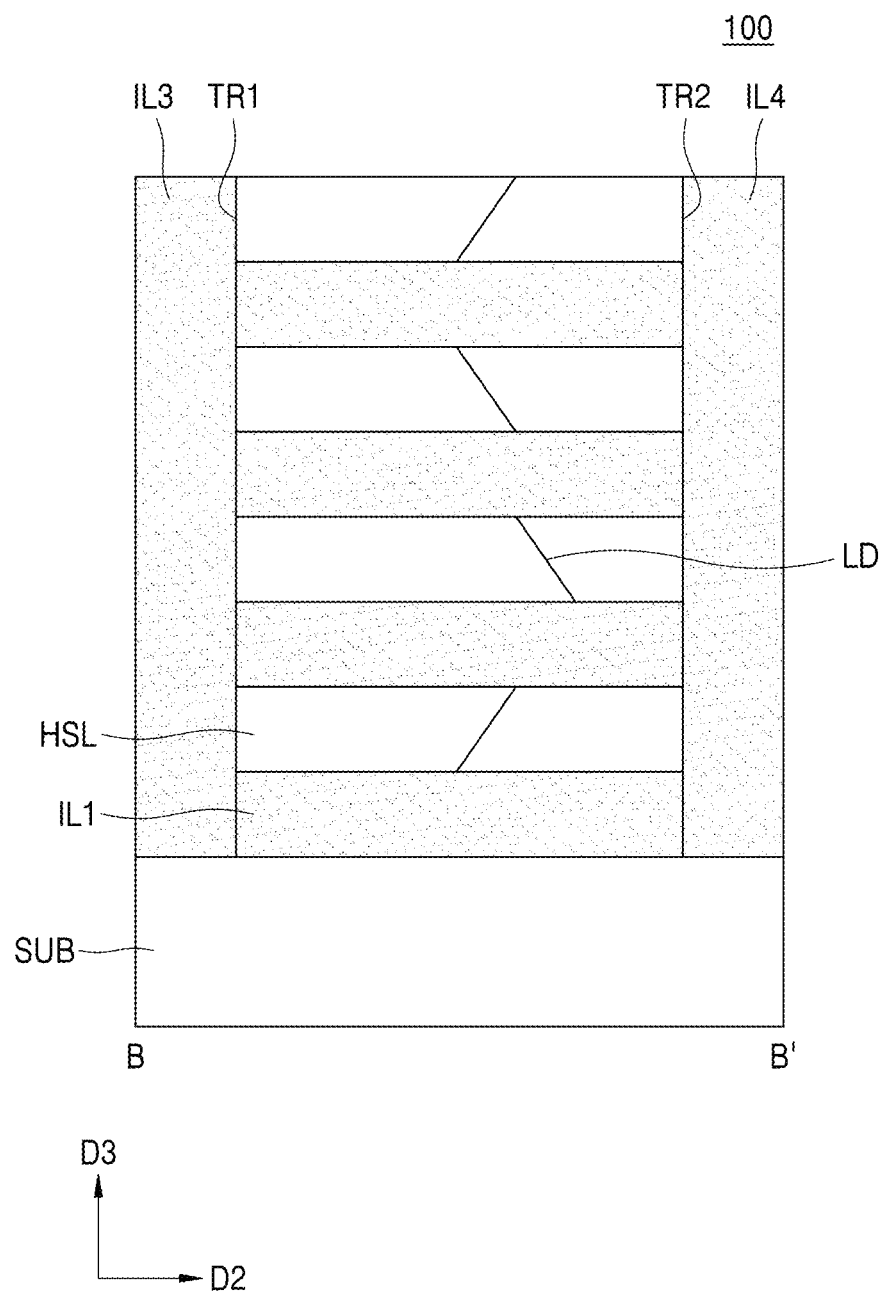
FIGS. 8C, 9C, 10C, 11C, 12C, 13C, and 14C are cross-sectional views taken along line B-B' in FIGS. 8A, 9A, 10A, 11A, 12A, 13A, and 14A, respectively, according to embodiments.
Figure 9A:
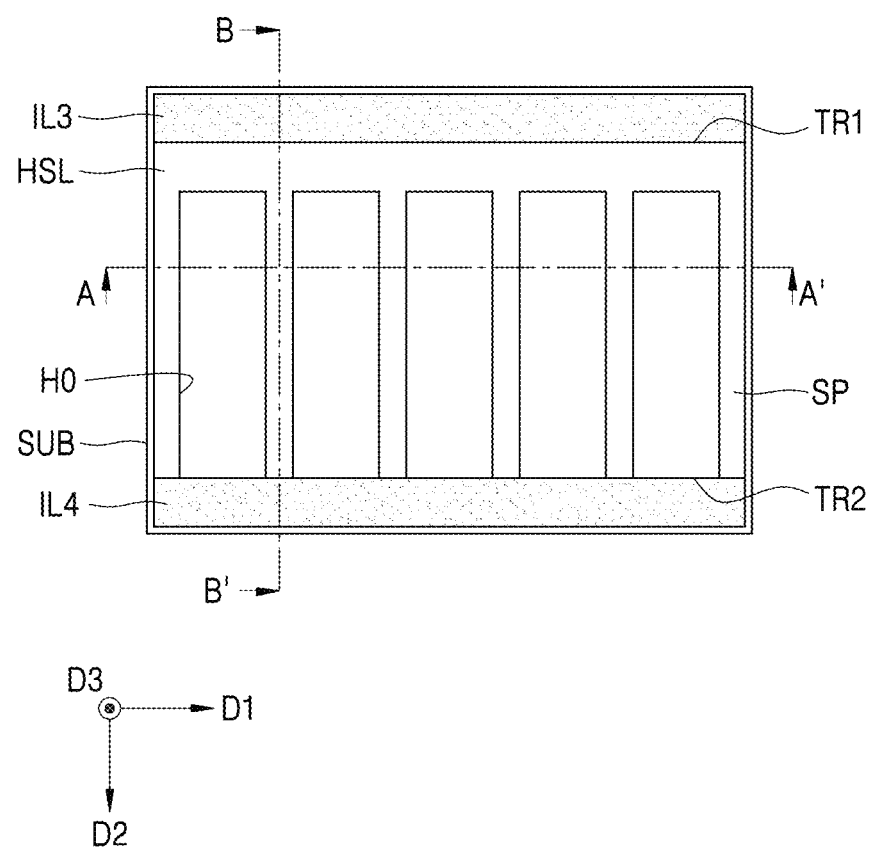
Figure 9B:
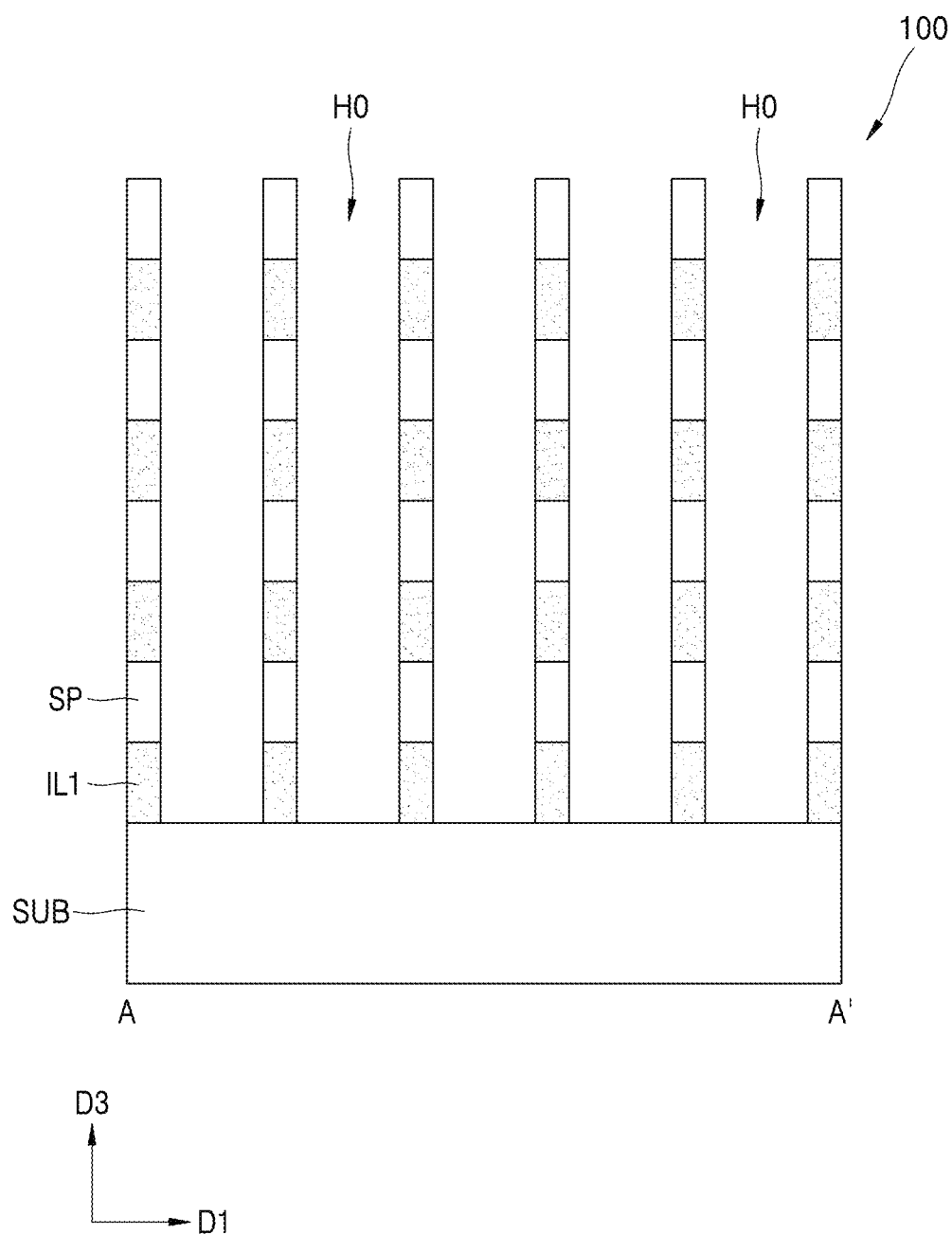
Figure 9C:
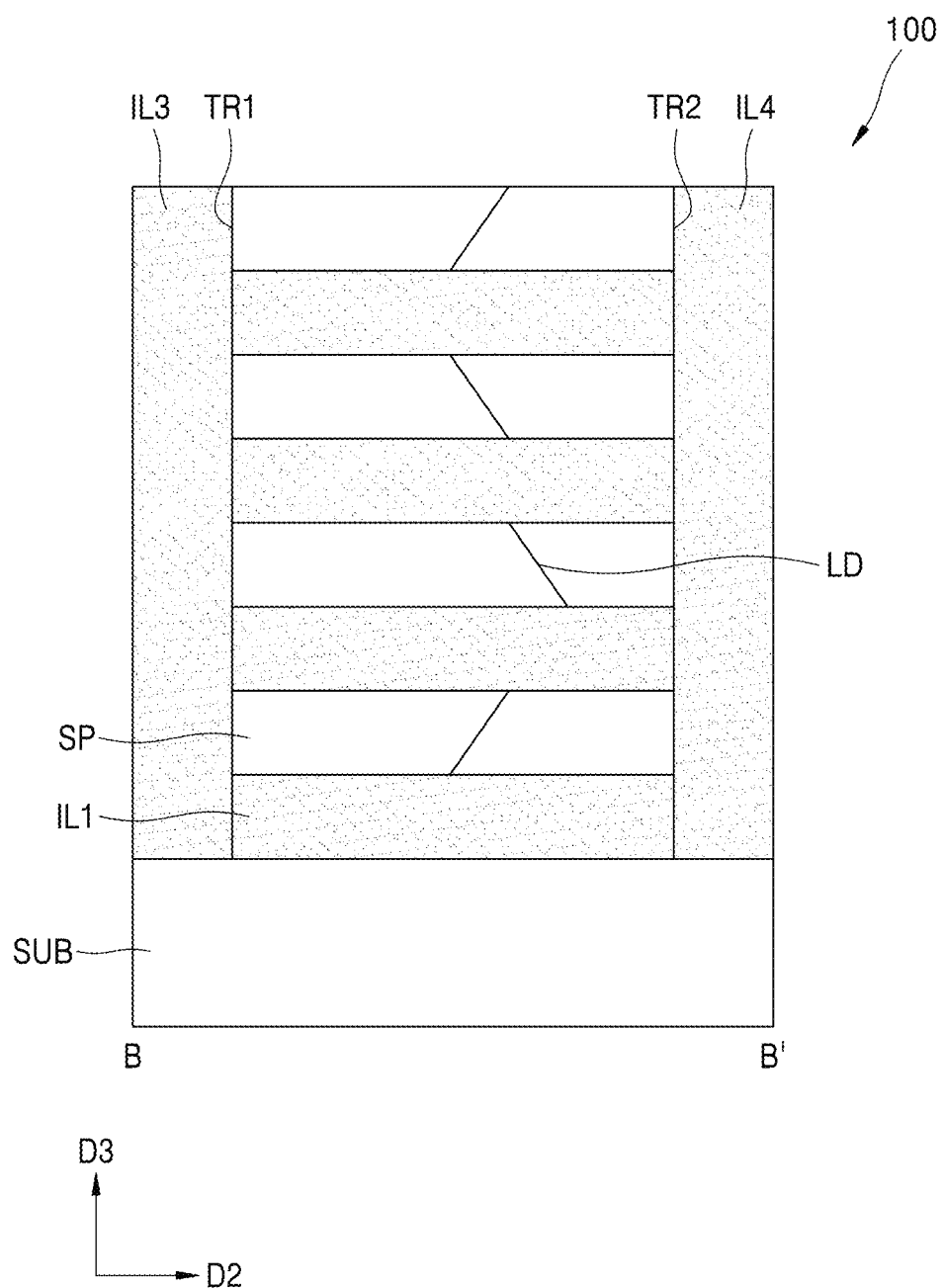
Figure 10A:
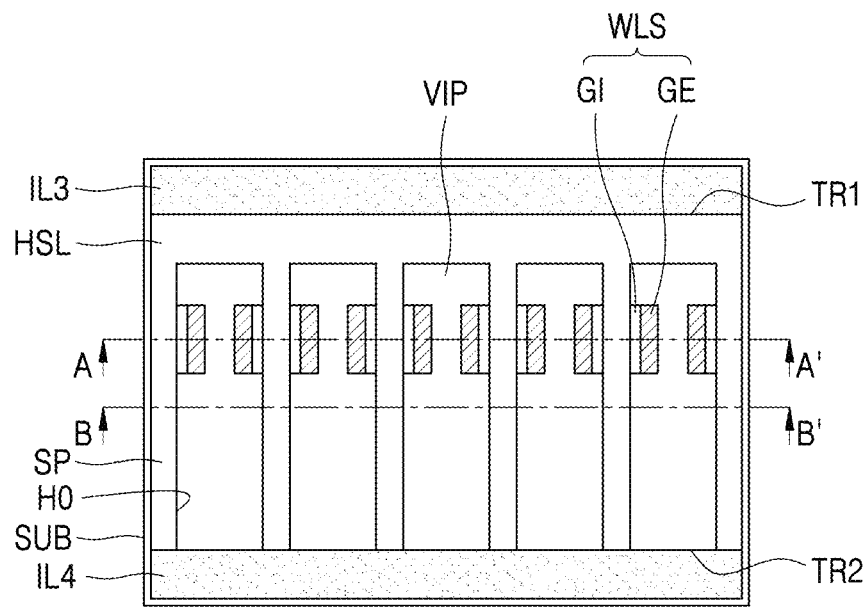
Figure 10A:
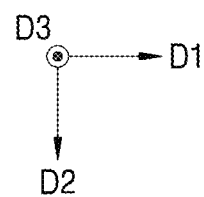
Figure 10B:
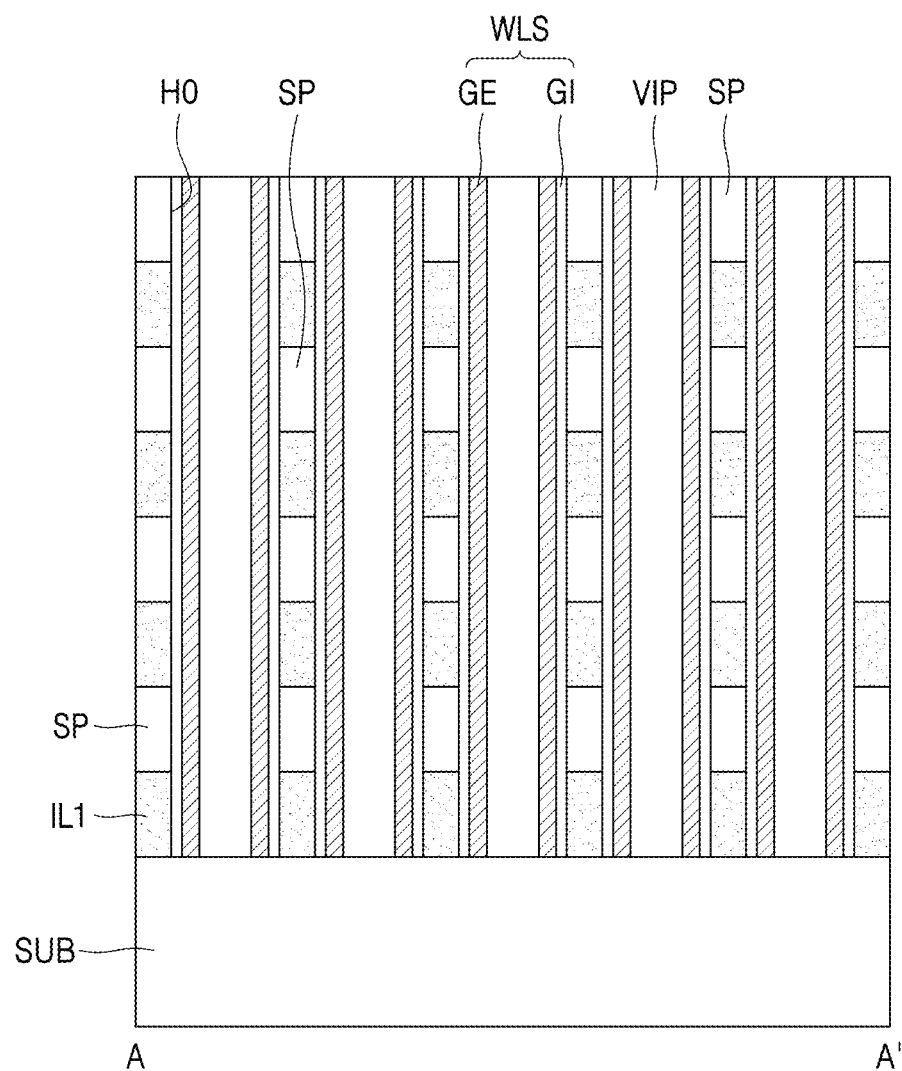
Figure 10C:
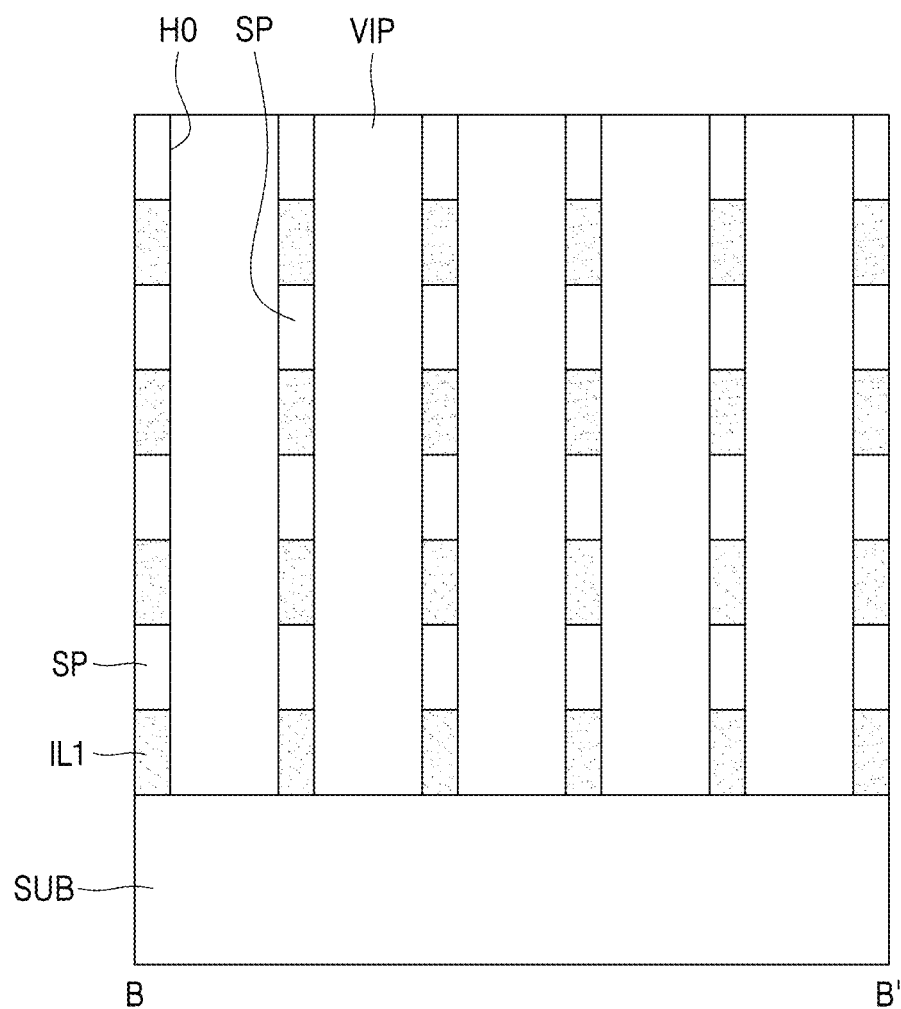
Figure 11A:
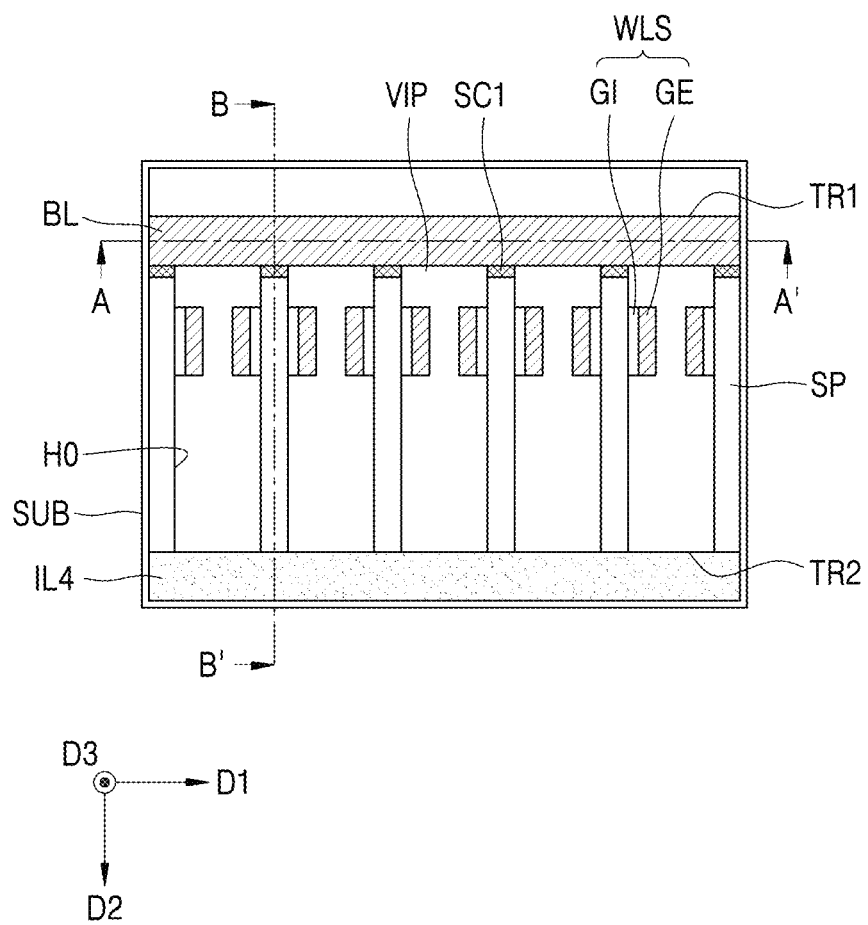
Figure 11B:
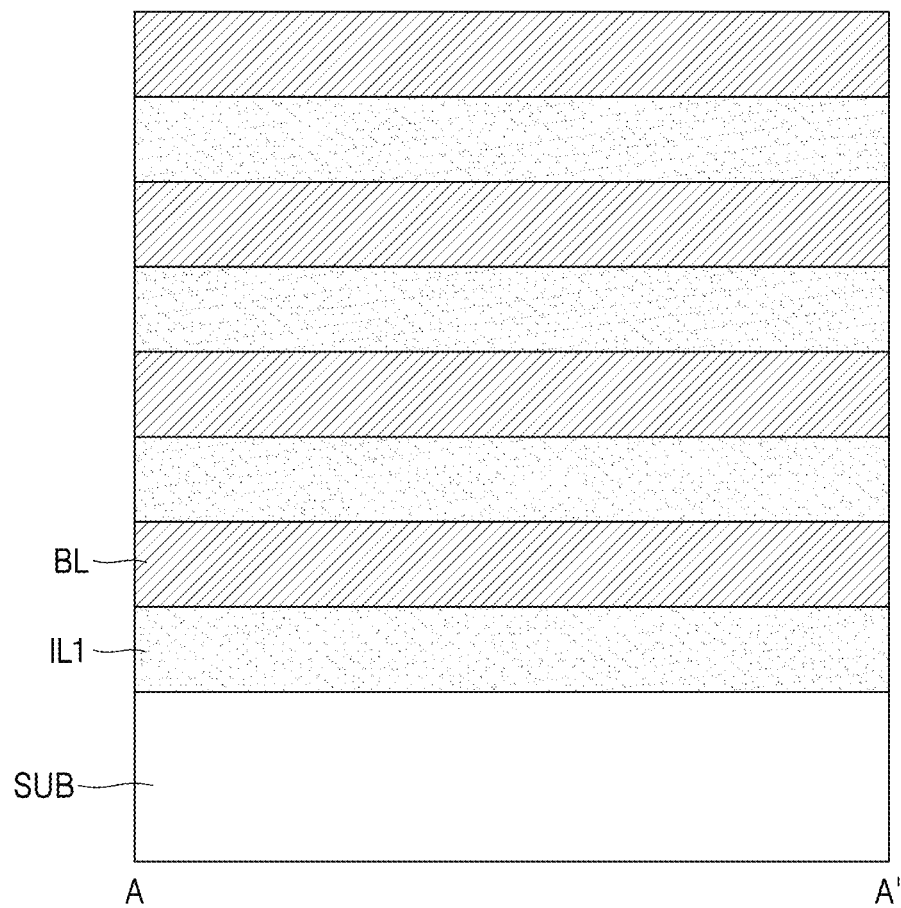
Figure 11C:
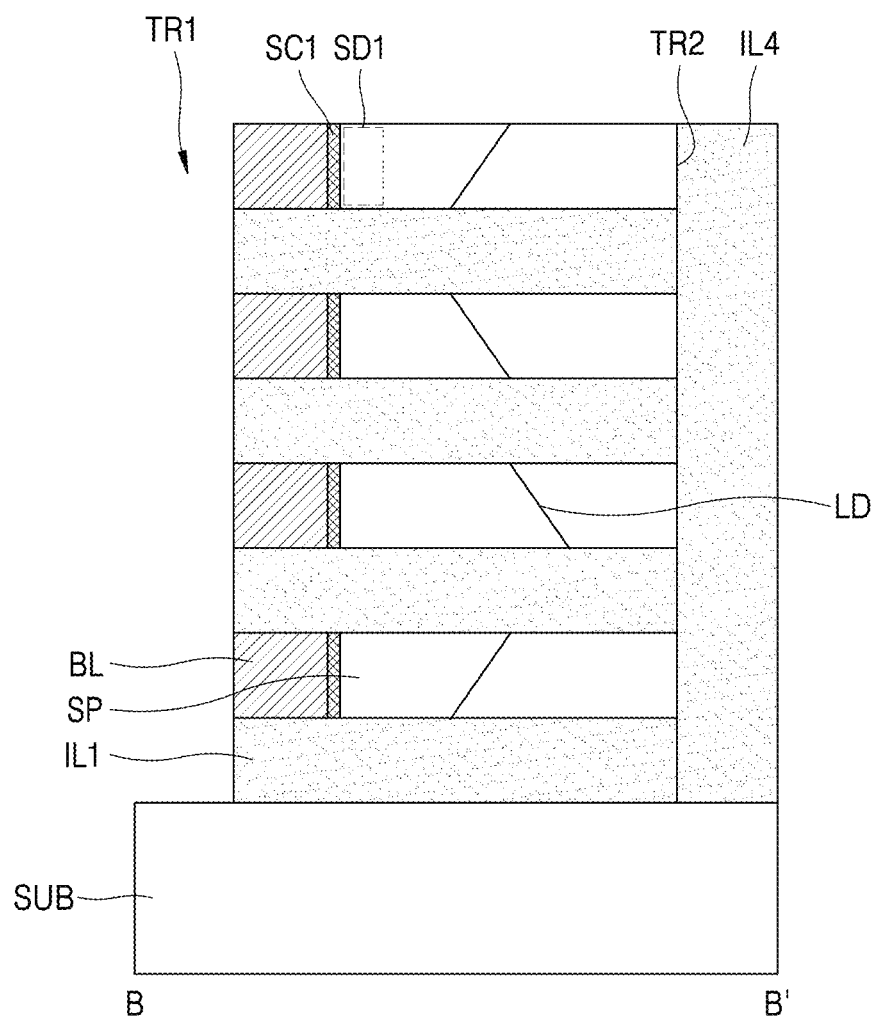
Figure 12A:
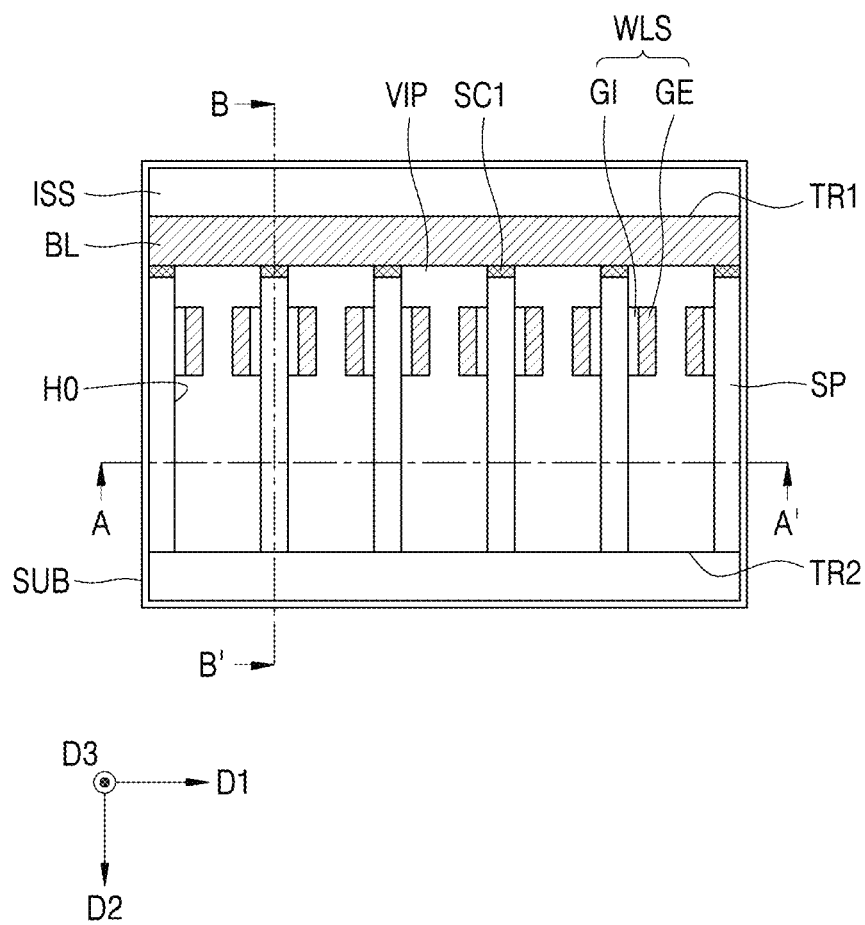
Figure 12B:
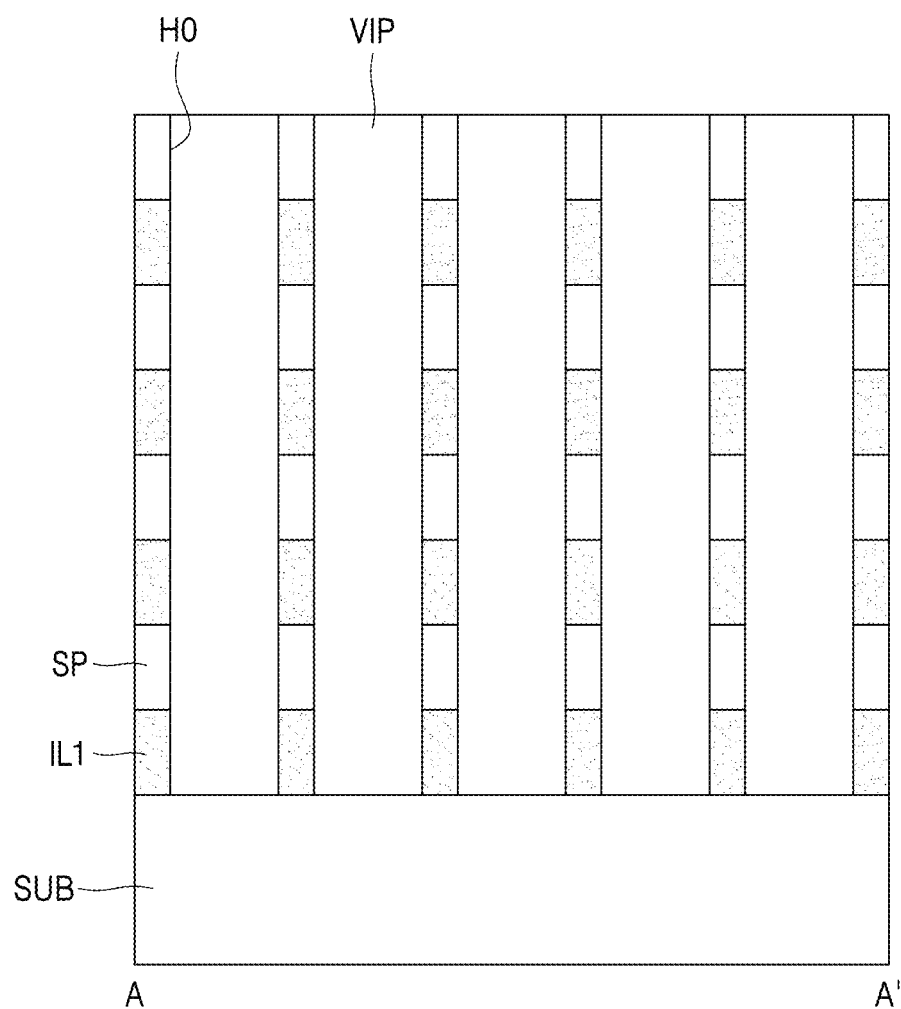
Figure 12C:
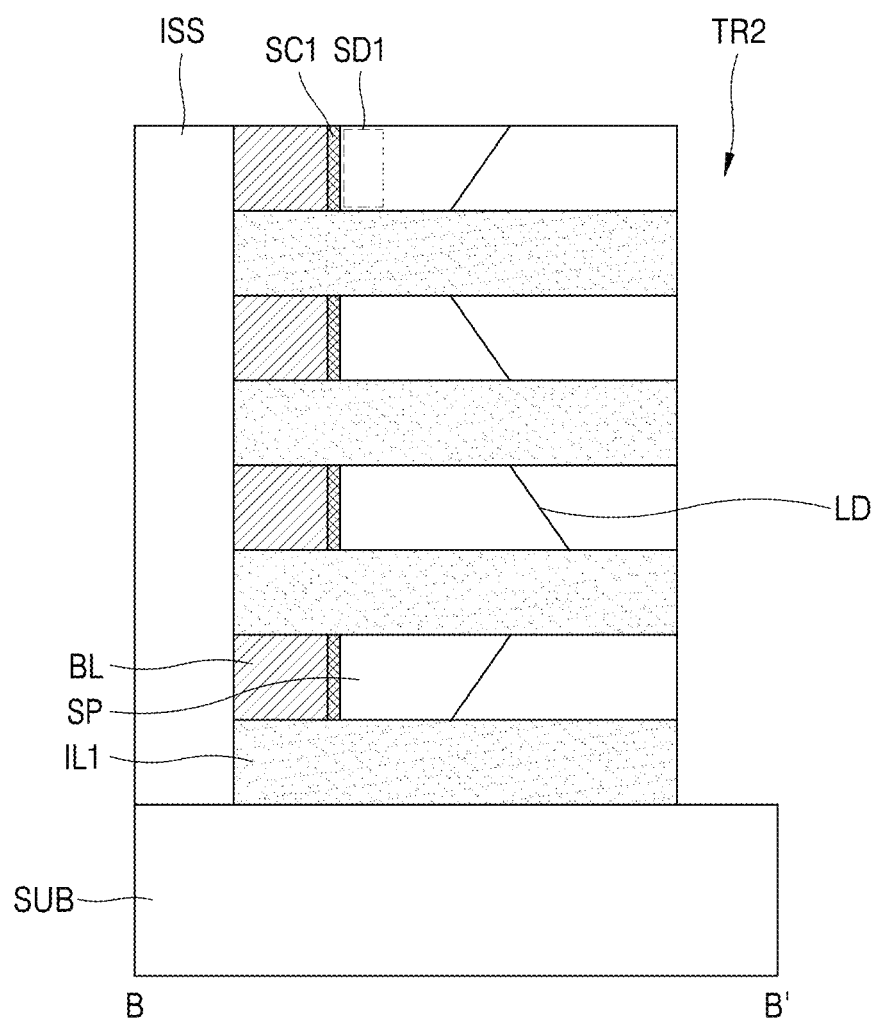
Figure 13A:
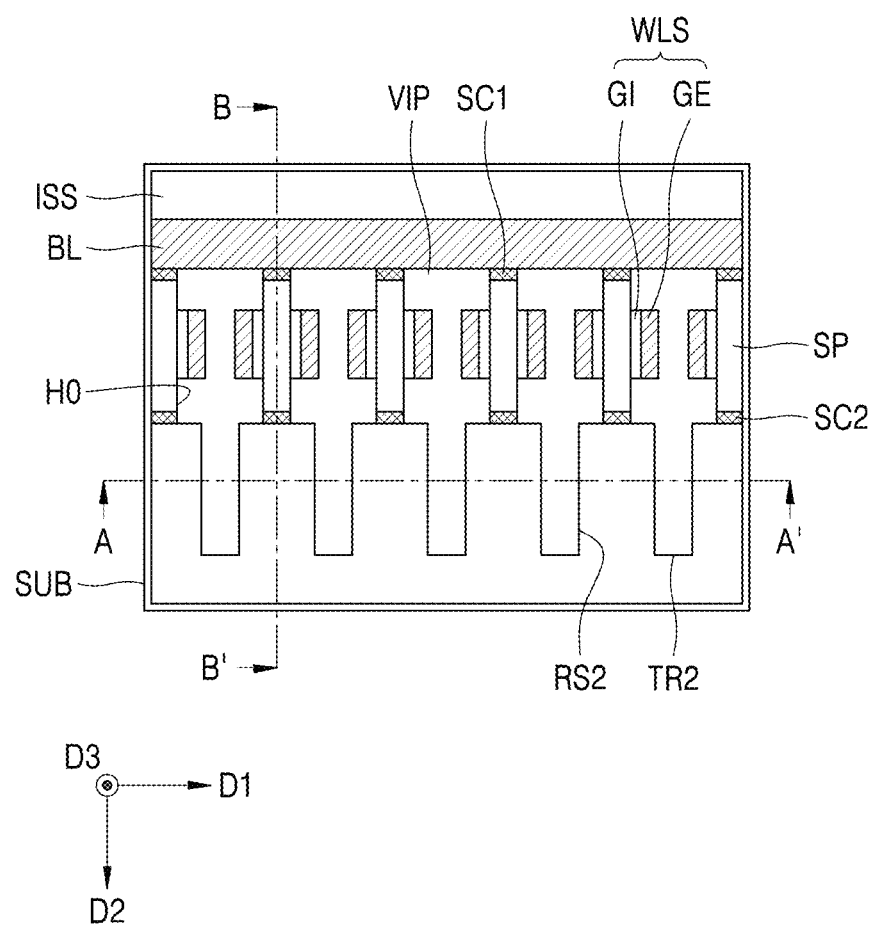
Figure 13B:
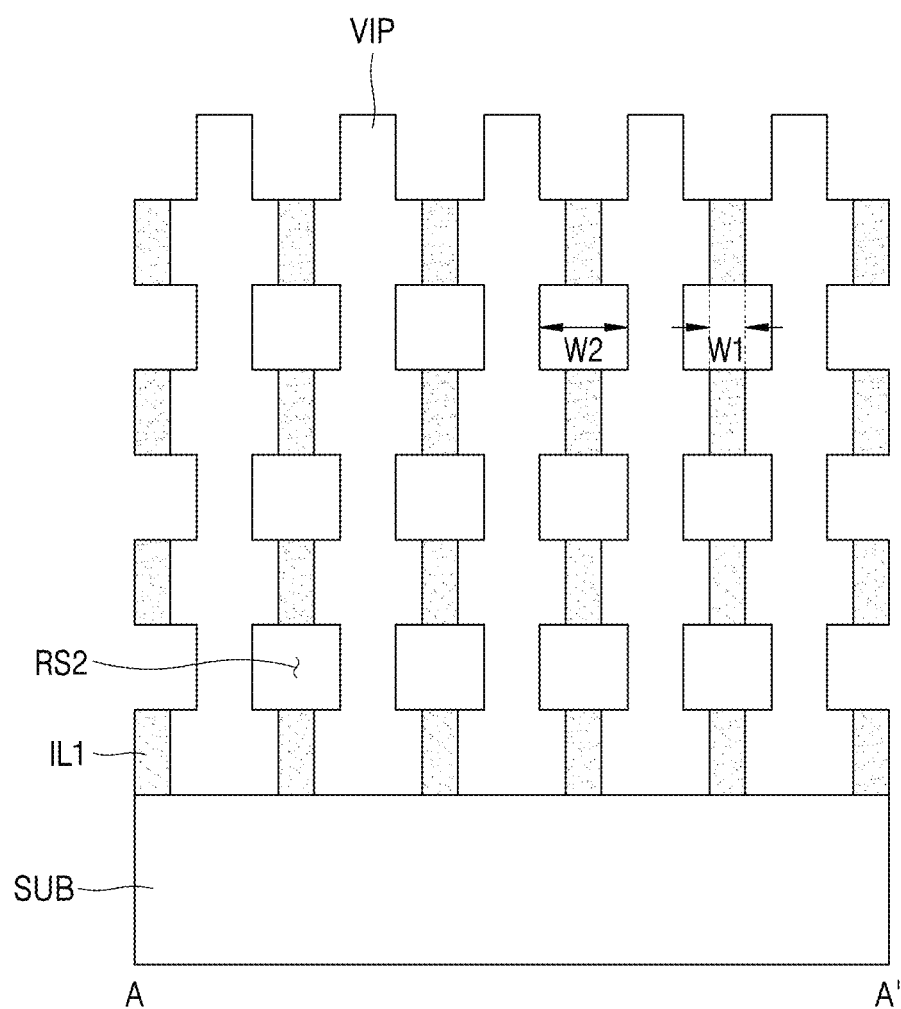
Figure 13C:
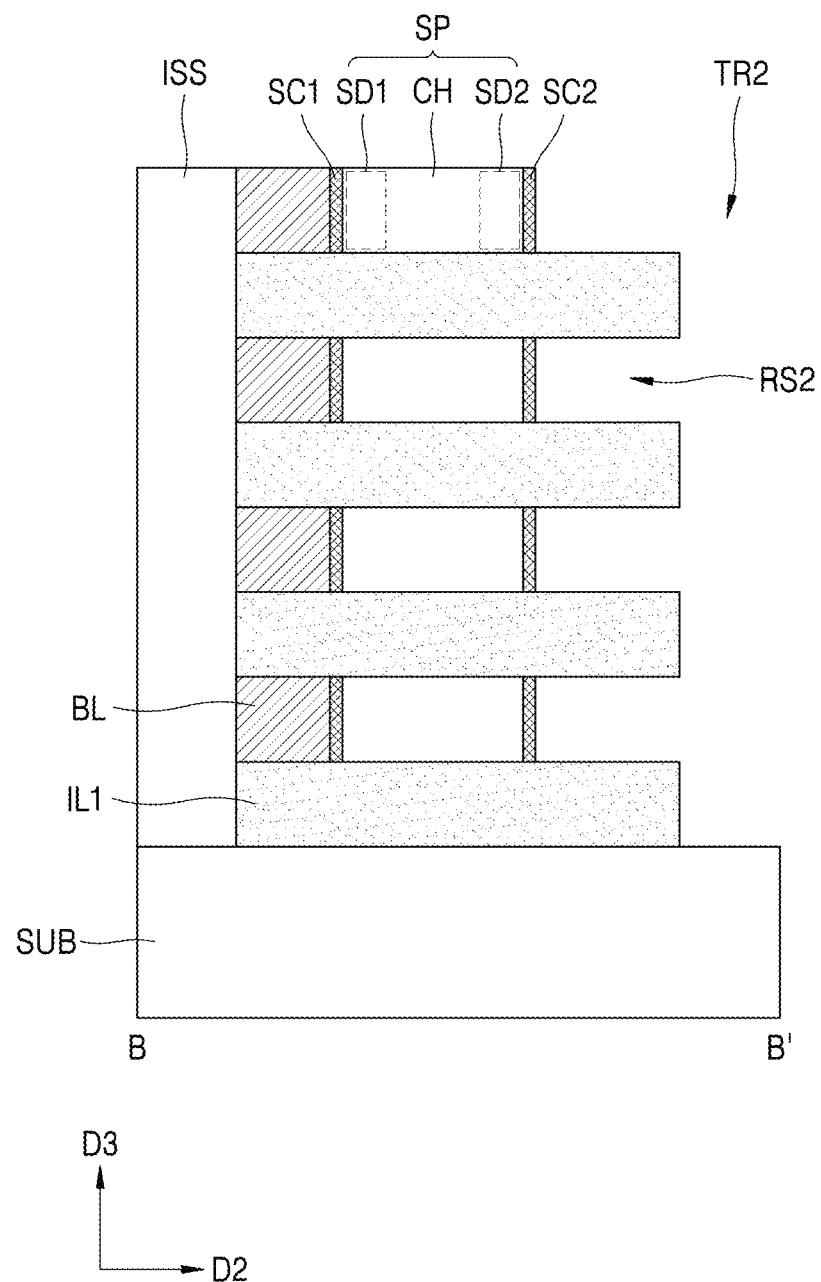
Figure 14A:
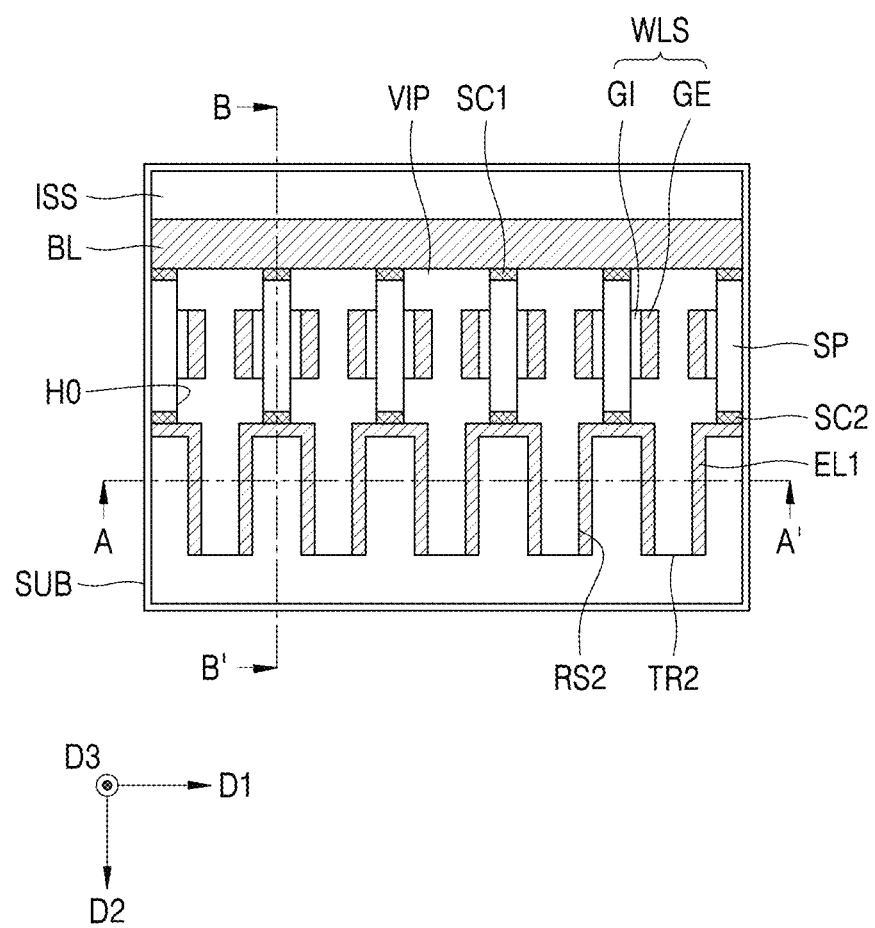
Figure 14B:
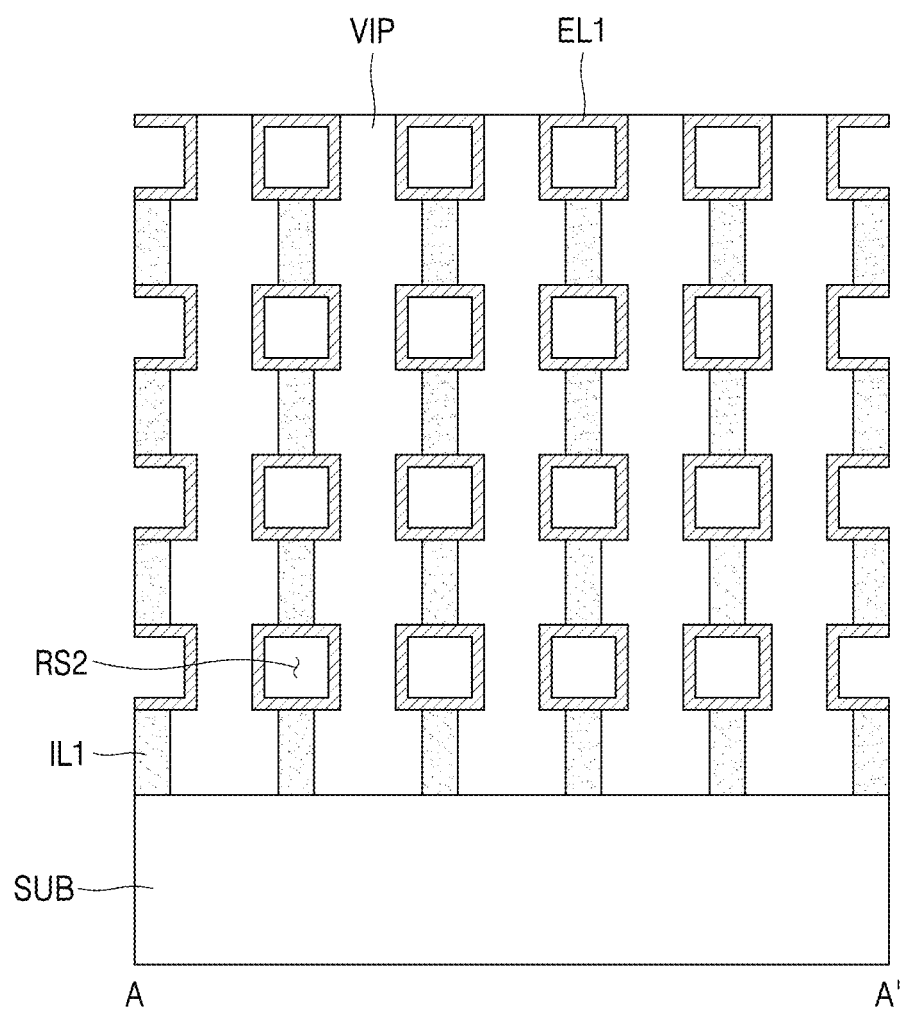
Figure 14C:
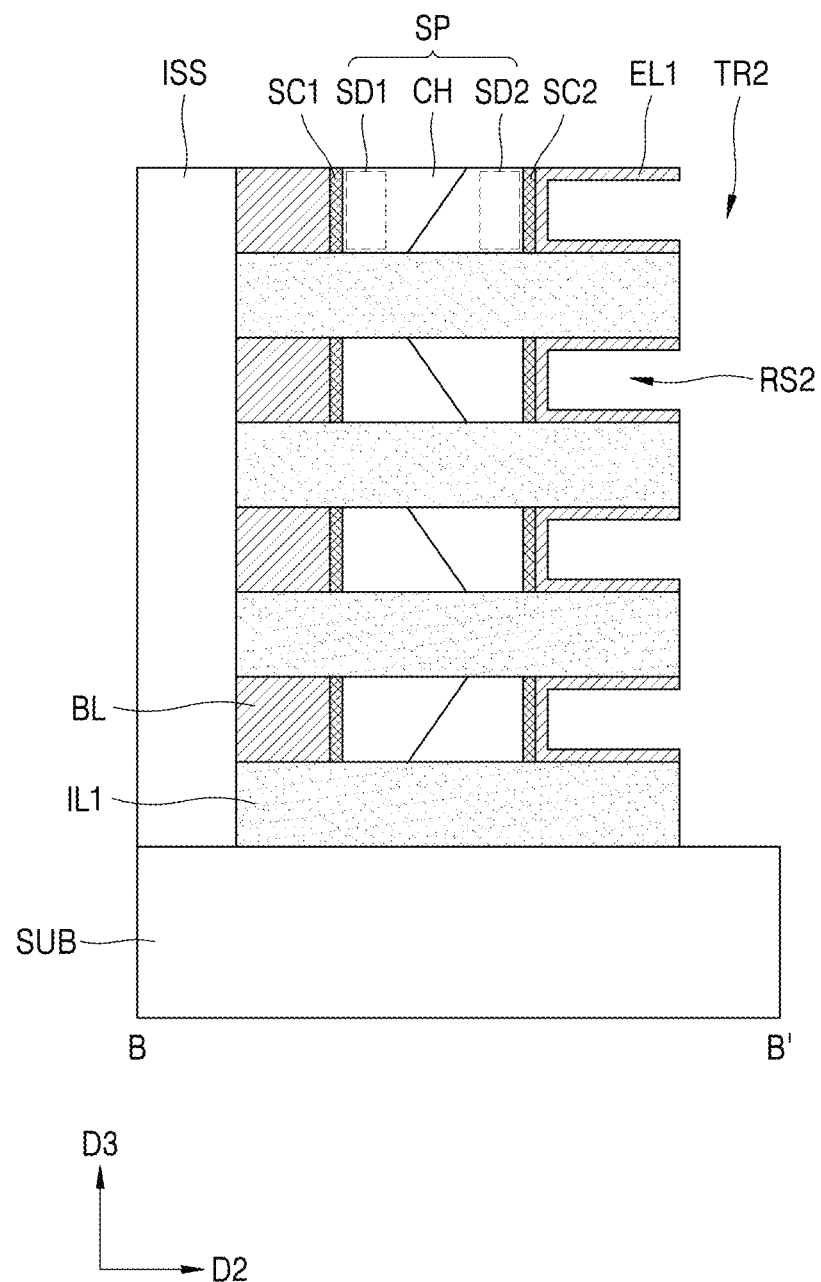

In other words, FIG. 8B illustrates a cross-sectional view taken along line A-A' of FIG. 8A, and FIG. 8C illustrates a cross-sectional view taken along line B-B' of FIG. 8A. FIG. 9B illustrates a cross-sectional view taken along line A-A' of FIG. 9A, and FIG. 9C illustrates a cross-sectional view taken along line B-B' of FIG. 9A. FIG. 10B illustrates a cross-sectional view taken along line A-A' of FIG. 10A, and FIG. 10C illustrates a cross-sectional view taken along line B-B' of FIG. 10A. FIG. 11B illustrates a cross-sectional view taken along line A-A' of FIG. 11, and FIG. 11C illustrates a cross-sectional view taken along line B-B' of FIG. 11A. FIG. 12B illustrates a cross-sectional view taken along line A-A' of FIG. 12A, and FIG. 12C illustrates a cross-sectional view taken along line B-B' of FIG. 12A. FIG. 13B illustrates a cross-sectional view taken along line A-A' of FIG. 13A, and FIG. 13C illustrates a cross-sectional view taken along line B-B' of FIG. 13A. FIG. 14B illustrates a cross-sectional view taken along line A-A' of FIG. 14A, and FIG. 14C illustrates a cross-sectional view taken along line B-B' of FIG. 14A.

Referring to FIGS. 8A through 8C, the stack structure 100 manufactured by the method of FIGS. 5A through 5F, FIGS. 6A through 6E, or FIGS. 7A through 7G may be provided. For convenience of illustration, only half of the stack structure 100 of FIG. 5F, 6E, or 7G is shown.

The stack structure 100 may include a plurality of first insulating layers IL1 and a plurality of horizontal semiconductor patterns HSL, which are stacked alternately with each other on the substrate SUB in the vertical direction D3. The stack structure 100 may further include the third insulating layer IL3 and the fourth insulating layer IL4, which pass through the stack structure 100. The fourth insulating layer IL4 may be separated from the third insulating layer IL3 in the second horizontal direction D2. The first insulating layers IL1 and the horizontal semiconductor patterns HSL may extend between the fourth insulating layer IL4 and the third insulating layer IL3. The horizontal semiconductor patterns HSL may be monocrystalline. The crystal orientation of at least one of the horizontal semiconductor patterns HSL may be different from the crystal orientation of another one of the horizontal semiconductor patterns HSL. At least one of the horizontal semiconductor patterns HSL may have the lattice defect LD.

Referring to FIGS. 9A through 9C, a plurality of holes HO may be formed to pass through a plurality of semiconductor patterns SP and first insulating layers IL1 of the stack structure 100. Each of the holes HO may extend in the second horizontal direction D2, and the holes HO may be separated from each other in the first horizontal direction D1. The semiconductor patterns SP may be defined by the holes HO in a single horizontal semiconductor pattern HSL. For example, a semiconductor pattern SP may be defined by two adjacent holes HO. Each of the semiconductor patterns SP may extend in the second horizontal direction D2. The semiconductor patterns SP may be separated from each other in the first horizontal direction D1.

Referring to FIGS. 10A through 10C, two gate electrodes GE and two gate insulating layers GI may be formed in each of the holes HO so that two word line structures WLS may be formed. In detail, a plurality of gate electrodes GE and a plurality of gate insulating layers GI may be formed by forming and patterning a gate electrode layer and a gate insulating material layer in the holes HO. Thereafter, a vertical insulating layer VIP may be formed to fill each of the holes HO.

Referring to FIGS. 10A through 10C and FIGS. 11A through 11C, the third insulating layer IL3 may be removed, and a portion of the horizontal semiconductor pattern HSL may be selectively removed through the first trench TR1. A bit line BL may be formed in a space resulting from the removal of the horizontal semiconductor pattern HSL.

In some embodiments, the first silicide pattern SC1 may be formed between the bit line BL and each of the semiconductor patterns SP. For example, before the bit line BL is formed, a portion of a semiconductor pattern SP of the horizontal semiconductor pattern HSL exposed by the first trench TR1 may be made into silicide.

The first source/drain region SD1 may also be formed in the semiconductor pattern SP. The first source/drain region SD1 may be formed by doping an end portion of the semiconductor pattern SP of the horizontal semiconductor pattern HSL exposed by the first trench TR1 with impurities before the bit line BL is formed.

Referring to FIGS. 11A through 11C and FIGS. 12A through 12C, the insulating structure ISS may be formed beside the bit line BL to fill the first trench TR1. In addition, a side wall of each semiconductor pattern SP, a side wall of each first insulating layer ILL and a side wall of each vertical insulating layer VIP may be exposed by the second trench TR2 by removing the fourth insulating layer IL4.

Referring to FIGS. 13A through 13B, a second recess RS2 may be formed by partially removing the semiconductor pattern SP exposed by the second trench TR2. The second recess RS2 may be defined by two adjacent first insulating layers IL1 and the semiconductor pattern SP between the two adjacent first insulating layers ILL The second recess RS2 may have a first width W1 in the first horizontal direction D1. The first width W1 may be substantially the same as a width of the semiconductor pattern SP.

The second recess RS2 may extend in the first horizontal direction D1 by etching the vertical insulating layer VIP through the second recess RS2. Accordingly, the first width W1 of the second recess RS2 may increase to a second width W2 in the first horizontal direction D1.

In some embodiments, the second silicide pattern SC2 may be formed on the semiconductor pattern SP exposed by the second recess RS2. The second silicide pattern SC2 may be formed by making an end portion of the semiconductor pattern SP, which is exposed by the second recess RS2, into silicide.

In addition, the second source/drain region SD2 may be formed in the semiconductor pattern SP. The second source/drain region SD2 may be formed by doping the semiconductor pattern SP, which is exposed by the second recess RS2, with impurities before the second silicide pattern SC2 is formed.

Referring to FIGS. 14A through 14C, the first electrode EL1 may be formed in the second recess RS2. In detail, a plurality of first electrodes EL1 may be formed from a first electrode layer by conformally forming the first electrode layer in a plurality of second recesses RS2 and wet etching the first electrode layer.

Referring to FIGS. 3 through 4C, the dielectric layer DL may be conformally formed on the first electrodes EL1. Subsequently, the second electrode EL2 may be formed on the dielectric layer DL. The second electrode EL2 may be formed to fill the second recesses RS2, as shown for example in FIG. 14C, and the second trench TR2, as shown for example in FIG. 14C. The semiconductor memory device illustrated in FIGS. 3 through 4C may be manufactured by the method described with reference to FIGS. 3 through 4C and FIGS. 8A through 14C.

Figure 15:
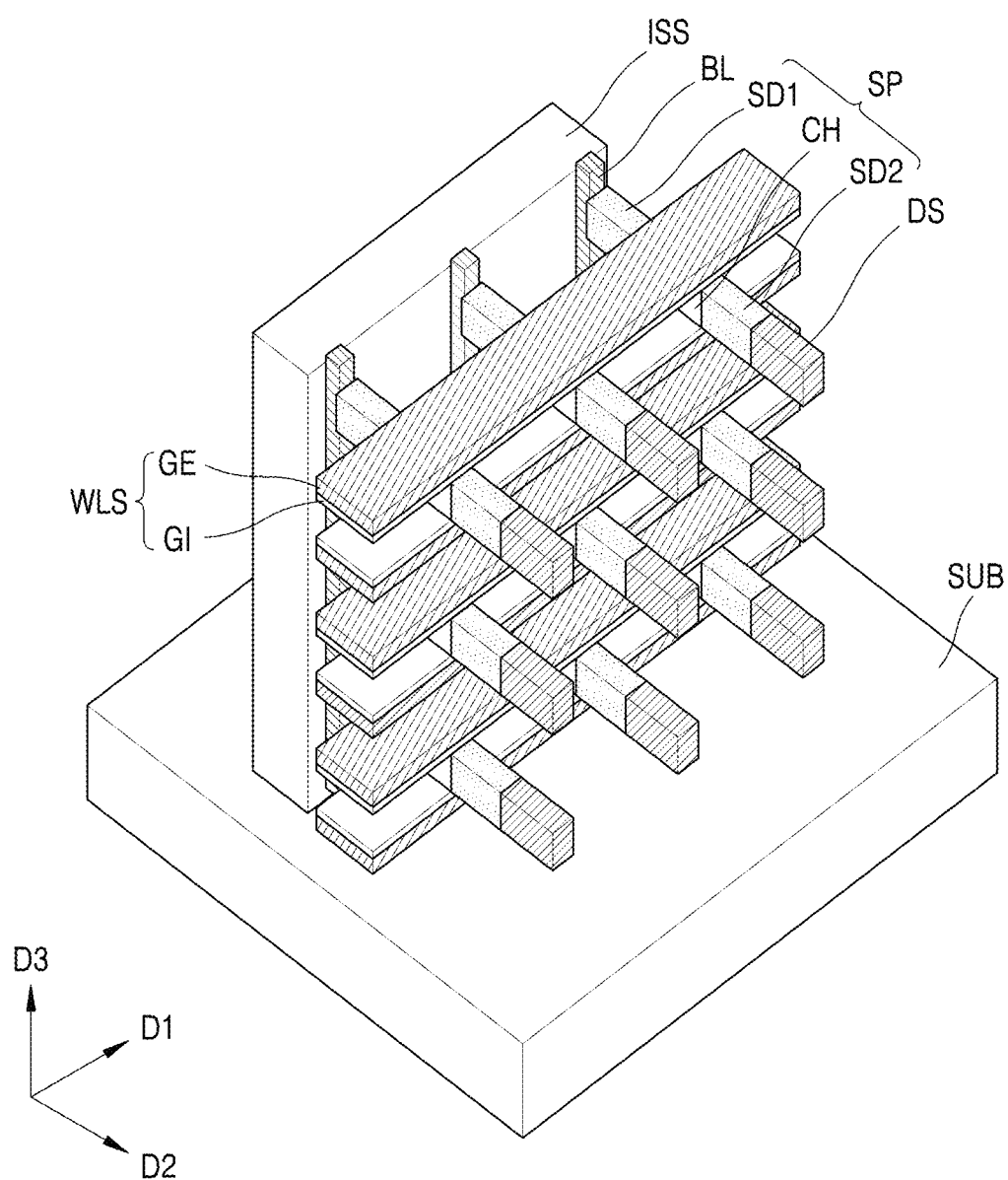
FIG. 15 is a perspective view of a semiconductor memory device according to an embodiment.

FIG. 15 is a perspective view of a semiconductor memory device according to an embodiment. Differences between the semiconductor memory device described with reference to FIG. 2 and the semiconductor memory device of FIG. 15 will be described below.

Referring to FIG. 15, each of a plurality of bit lines BL may extend in the vertical direction D3, and the bit lines BL may be separated from each other in the first horizontal direction D1. Respective first source/drain regions SD1 of a plurality of semiconductor patterns SP, which are separated from each other in the vertical direction D3, may be electrically connected to the same bit line BL. Respective first source/drain regions SD1 of a plurality of semiconductor patterns SP, which are separated from each other in the first horizontal direction D1, may be electrically connected to different bit lines BL.

Each of a plurality of word line structures WLS may extend in the first horizontal direction D1, and the word line structures WLS may be separated from each other in the vertical direction D3. The semiconductor patterns SP, which are separated from each other in the first horizontal direction D1, may be in contact with the same word line structure WLS. The word line structure WLS may be in contact with opposite surfaces of each of the semiconductor patterns SP, which are separated from each other in the first horizontal direction D1. The semiconductor patterns SP, which are separated from each other in the vertical direction D3, may be in contact with different word line structures WLS.

Figure 16A:
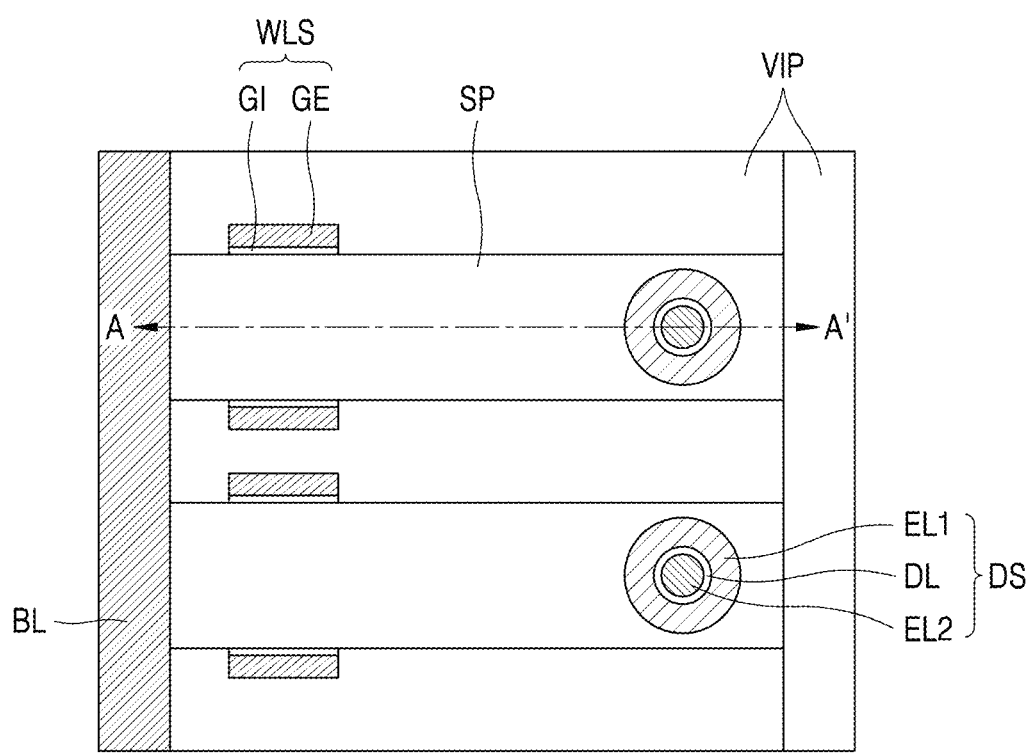
FIG. 16A is a plan view of a semiconductor memory device according to an embodiment.
Figure 16A:
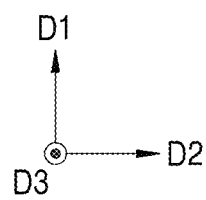
Figure 16B:
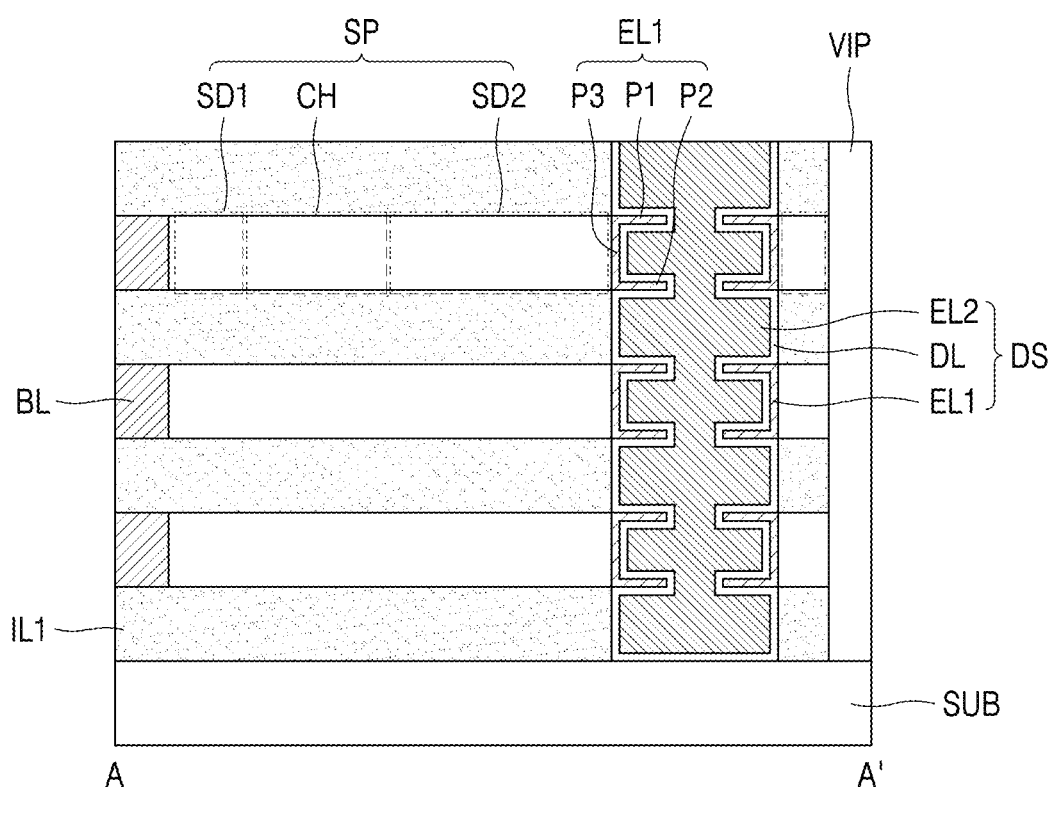
FIG. 16B is a cross-sectional view taken along line A-A' in FIG. 16A, according to an embodiment.

FIG. 16A is a plan view of a semiconductor memory device according to an embodiment. FIG. 16B illustrates a cross-sectional view taken along line A-A' in FIG. 16A, according to an embodiment. Differences between the semiconductor memory device described with reference to FIGS. 3 through 4C and the semiconductor memory device of FIG. 16 will be described below.

Referring to FIGS. 16A and 16B, a first electrode EL1 may include a top plate P1, a bottom plate P2, and a side wall P3 extending between the top plate P1 and the bottom plate P2. The top plate P1 and the bottom plate P2 may be perpendicular to the vertical direction D3. The side wall P3 may extend in the vertical direction D3. In the plan view, the top plate P1, the bottom plate P2, and the side wall P3 may form a closed-loop. For example, in the plan view, the top plate P1, the bottom plate P2, and the side wall P3 may form a circle.

In some embodiments, a semiconductor pattern SP may be along the full circumference of the side wall P3. In other words, the first electrode EL1 may pass through the semiconductor pattern SP. A portion of the semiconductor pattern SP may be between the side wall P3 and the vertical insulating layer VIP.

The dielectric layer DL may be conformally formed on the first electrode EL1. The second electrode EL2 may be arranged on the dielectric layer DL. The second electrode EL2 may pass through a plurality of first electrodes EL1, which are stacked in the vertical direction D3. The second electrode EL2 may have a pillar shape extending in the vertical direction D3. In other words, the first electrodes EL1 may be arranged along the circumference of the second electrode EL2. In the cross-sectional view, the second electrode EL2 may have a fish-bone shape expending in the vertical direction D3.

While embodiments have been particularly shown and described, it will be understood that various changes in form and details may be made therein without departing from the spirit and scope of the following claims.

What is claimed is:

1. A semiconductor memory device comprising:
   a first semiconductor pattern, and a second semiconductor pattern separated from the first semiconductor pattern in a vertical direction;
   a first bit line electrically connected to a first source/drain region of the first semiconductor pattern, and a second bit line electrically connected to a first source/drain region of the second semiconductor pattern;
   a word line structure in contact with the first semiconductor pattern and the second semiconductor pattern; and
   a first data storage element electrically connected to a second source/drain region of the first semiconductor pattern, and a second data storage element electrically connected to a second source/drain region of the second semiconductor pattern,
   wherein the first semiconductor pattern and the second semiconductor pattern are monocrystalline, and
   wherein a crystal orientation of the first semiconductor pattern is different from a crystal orientation of the second semiconductor pattern,
   wherein at least one of the first semiconductor pattern and the second semiconductor pattern includes a lattice defect extending to a bottom surface or top surface of the at least one of the first semiconductor pattern and the second semiconductor pattern.

2. The semiconductor memory device of claim 1, wherein the lattice defect extends at an oblique angle to the bottom surface or the top surface of the at least one of the first semiconductor pattern and the second semiconductor pattern.

3. The semiconductor memory device of claim 2, wherein the oblique angle is about 50 degrees to about 60 degrees.

4. The semiconductor memory device of claim 1, wherein the first bit line and the second bit line extend in a first horizontal direction, and
   wherein the second bit line is separated from the first bit line in the vertical direction.

5. The semiconductor memory device of claim 1, wherein the word line structure extends in the vertical direction.

6. The semiconductor memory device of claim 1, wherein each of the first semiconductor pattern and the second semiconductor pattern extends in a second horizontal direction.

7. The semiconductor memory device of claim 6, wherein the first source/drain region of the first semiconductor pattern is separated from the second source/drain region of the first semiconductor pattern in the second horizontal direction, and
   wherein the first source/drain region of the second semiconductor pattern is separated from the second source/drain region of the second semiconductor pattern in the second horizontal direction.

8. The semiconductor memory device of claim 1, wherein each of the first data storage element and the second data storage element includes a first electrode electrically connected to the second source/drain region of the first semiconductor pattern, a second electrode on the first electrode, and a dielectric layer between the first electrode and the second electrode.

9. The semiconductor memory device of claim 8, wherein the first data storage element shares the dielectric layer and the second electrode with the second data storage element.

10. The semiconductor memory device of claim 9, wherein the first electrode includes a first base and a first protrusion, the first base being electrically connected to the second source/drain region of the first semiconductor pattern, the first protrusion protruding from the first base in a second horizontal direction, and the first base and the first protrusion defining an internal space, and
    wherein the second electrode includes a second base and a plurality of second protrusions protruding from the second base in an opposite direction to the second horizontal direction, each of the plurality of second protrusions being in the internal space.

11. A semiconductor memory device comprising:
    a plurality of semiconductor patterns separated in a vertical direction;
    a bit line electrically connected to respective first source/drain regions of the plurality of semiconductor patterns;
    a plurality of word line structures in contact with the plurality of semiconductor patterns, respectively; and
    a plurality of data storage elements electrically connected to respective second source/drain regions of the plurality of semiconductor patterns,
    wherein the plurality of semiconductor patterns are monocrystalline, and
    wherein a crystal orientation of at least one of the plurality of semiconductor patterns is different from a crystal orientation of another one of the plurality of semiconductor patterns, and
    wherein the at least one of the plurality of semiconductor patterns includes a lattice defect extending to a bottom surface or top surface of the at least one of the plurality of semiconductor patterns.

12. The semiconductor memory device of claim 11, wherein each of the plurality of word line structures extends in a first horizontal direction, and
    wherein the plurality of word line structures are separated in the vertical direction.

13. The semiconductor memory device of claim 11, wherein the bit line extends in the vertical direction.

14. A semiconductor memory device comprising:
    a plurality of semiconductor patterns arranged in a vertical direction and a first horizontal direction, wherein each of the plurality of semiconductor patterns extends in a second horizontal direction;
    a plurality of insulating layers separating the plurality of semiconductor patterns in the vertical direction;
    a bit line electrically connected to respective first source/drain regions of some of the plurality of semiconductor patterns;
    a word line structure in contact with the some of the plurality of semiconductor patterns; and
    a plurality of data storage elements electrically connected to respective second source/drain regions of the plurality of semiconductor patterns,
    wherein the plurality of semiconductor patterns are monocrystalline, and wherein a crystal orientation of at least one of the plurality of semiconductor patterns is different from a crystal orientation of another one of the plurality of semiconductor patterns, and wherein the at least one of plurality of semiconductor patterns includes a lattice defect extending to a bottom surface or top surface of the at least one of the plurality of semiconductor patterns.

15. The semiconductor memory device of claim 14, wherein the bit line extends in the first horizontal direction and is located between two adjacent insulating layers among the plurality of insulating layers.

16. The semiconductor memory device of claim 14, wherein the word line structure extends in the vertical direction and is in contact with opposite side surfaces of each of the some of the plurality of semiconductor patterns.

17. The semiconductor memory device of claim 14, wherein the plurality of semiconductor patterns includes a semiconductor pattern, wherein the plurality of insulating layers includes an upper insulating layer on a top surface of the semiconductor pattern and a lower insulating layer on a bottom surface of the semiconductor pattern, and wherein the lattice defect extends at an oblique angle to at least one of a bottom surface of the upper insulating layer and a top surface of the lower insulating layer.

18. The semiconductor memory device of claim 17, wherein the lattice defect is in contact with the at least of the bottom surface of the upper insulating layer and the top surface of the lower insulating layer.

19. The semiconductor memory device of claim 17, wherein the lattice defect appears as a straight line on a cross-section of the semiconductor memory device that is perpendicular to the first horizontal direction.

20. The semiconductor memory device of claim 17, wherein the oblique angle is about 50 degrees to about 60 degrees.

* * * * *